US011298856B2

United States Patent
Chang et al.

(10) Patent No.: US 11,298,856 B2
(45) Date of Patent: Apr. 12, 2022

(54) OPTICAL POLYMER FILMS AND METHODS FOR CASTING THE SAME

(71) Applicant: Molecular Imprints, Inc., Austin, TX (US)

(72) Inventors: Chieh Chang, Cedar Park, TX (US); Christophe Peroz, San Francisco, CA (US); Roy Matthew Patterson, Hutto, TX (US); Matthew S. Shafran, Fletcher, NC (US); Christopher John Fleckenstein, Round Rock, TX (US); Charles Scott Carden, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 410 days.

(21) Appl. No.: 15/922,499

(22) Filed: Mar. 15, 2018

(65) Prior Publication Data

US 2018/0264691 A1 Sep. 20, 2018

Related U.S. Application Data

(60) Provisional application No. 62/472,380, filed on Mar. 16, 2017.

(51) Int. Cl.
*B29C 43/58* (2006.01)
*B29C 35/08* (2006.01)
(Continued)

(52) U.S. Cl.
CPC .............. *B29C 43/58* (2013.01); *B29C 33/10* (2013.01); *B29C 35/0805* (2013.01);
(Continued)

(58) Field of Classification Search
CPC ......... B29C 43/58; B29C 33/10; B29C 43/54; B29C 35/0805; B29C 43/56;
(Continued)

(56) References Cited

U.S. PATENT DOCUMENTS 3,754,848 A 8/1973 Choate
4,017,183 A 4/1977 Lenz et al.
(Continued)

FOREIGN PATENT DOCUMENTS

GB 1101202 A 1/1968
JP 2006202920 A 8/2006
(Continued)

OTHER PUBLICATIONS

International Search Report and Written Opinion for International Application No. PCT/US2018/022642, dated Jun. 6, 2018, 15 pages.
(Continued)

*Primary Examiner* — Michael M. Robinson
(74) *Attorney, Agent, or Firm* — Fish & Richardson P.C.

(57) ABSTRACT

An example system is configured to photocure a photocurable material to form a polymer film. The system includes a first chuck configured to support a first substantially planar mold, a second chuck configured to support a second substantially planar mold, and an actuable stage coupled to the first chuck and/or the second chuck. The actuable stage is configured to position the first chuck and/or the second chuck so that the first and second molds are separated by a gap. The system also includes a sensor arrangement for obtaining measurement information indicative of a distance between the first and second molds and/or a pressure between the first and second chucks at each of at least three locations. The system also includes a control module con-
(Continued)

figured control the gap between the first and second molds based on the measurement information.

18 Claims, 20 Drawing Sheets

(51) Int. Cl.
| | |
|---|---|
| *G02B 1/04* | (2006.01) |
| *B29C 33/10* | (2006.01) |
| *B29C 43/54* | (2006.01) |
| *G03F 7/00* | (2006.01) |
| *B29L 11/00* | (2006.01) |
| *B29C 37/00* | (2006.01) |
| *B29C 43/56* | (2006.01) |

(52) U.S. Cl.
CPC ............... *B29C 43/54* (2013.01); *G02B 1/04* (2013.01); *G03F 7/0002* (2013.01); *B29C 35/0888* (2013.01); *B29C 2035/0827* (2013.01); *B29C 2035/0833* (2013.01); *B29C 2037/90* (2013.01); *B29C 2043/561* (2013.01); *B29C 2043/5833* (2013.01); *B29C 2043/5841* (2013.01); *B29L 2011/00* (2013.01)

(58) Field of Classification Search
CPC .... B29C 2043/5841; B29C 2043/5833; B29C 35/0888; B29C 2035/0833; B29C 2035/0827; B29C 2037/90; B29C 2043/561; B29C 33/30; B29C 33/26; G02B 1/04; B29L 2011/00; G03F 7/0002
See application file for complete search history.

(56) References Cited

U.S. PATENT DOCUMENTS

| | | | |
|---|---|---|---|
| 5,269,978 | A | 12/1993 | Umetsu et al. |
| 5,744,357 | A | 4/1998 | Wang et al. |
| 6,206,673 | B1 | 3/2001 | Lipscomb et al. |
| 7,029,607 | B2 | 4/2006 | Shimizu et al. |
| 9,194,700 | B2 | 11/2015 | Kast |
| 9,373,604 | B2 | 6/2016 | Yu et al. |
| 2001/0045676 | A1 | 11/2001 | Winterton et al. |
| 2002/0115002 | A1 | 8/2002 | Bailey et al. |
| 2003/0031116 | A1 | 2/2003 | Takeda et al. |
| 2003/0169400 | A1 | 9/2003 | Buazza et al. |
| 2003/0218803 | A1 | 11/2003 | Nakabayashi |
| 2005/0158003 | A1 | 7/2005 | Ohtsu et al. |
| 2007/0037897 | A1 | 2/2007 | Wang et al. |
| 2007/0060849 | A1 | 3/2007 | Bluman |
| 2007/0104440 | A1 | 5/2007 | Kim et al. |
| 2007/0188837 | A1 | 8/2007 | Shimizu et al. |
| 2008/0090155 | A1 | 4/2008 | Stewart et al. |
| 2008/0099941 | A1 | 5/2008 | Suehira |
| 2010/0059914 | A1* | 3/2010 | Cherala ................ G03F 7/0002 269/21 |
| 2010/0078854 | A1* | 4/2010 | Berggren ............. G03F 7/0002 264/293 |
| 2011/0097827 | A1* | 4/2011 | Hatano ................. B82Y 10/00 438/16 |
| 2012/0161367 | A1 | 6/2012 | Kim et al. |
| 2013/0162997 | A1 | 6/2013 | Kast et al. |
| 2013/0221549 | A1 | 8/2013 | Eguro et al. |
| 2013/0300011 | A1* | 11/2013 | Fujimoto .............. B29C 33/424 264/2.5 |
| 2013/0320589 | A1 | 12/2013 | Fujita |
| 2014/0239529 | A1 | 8/2014 | Tan et al. |
| 2014/0319707 | A1 | 10/2014 | Watanabe et al. |
| 2015/0054185 | A1 | 2/2015 | Watanabe |
| 2015/0276995 | A1 | 10/2015 | Nomura |
| 2016/0031151 | A1* | 2/2016 | Tan ........................ B82Y 10/00 264/40.5 |
| 2016/0056126 | A1 | 2/2016 | Yu et al. |
| 2016/0339626 | A1 | 11/2016 | Truskett |
| 2017/0315346 | A1 | 11/2017 | Tervo et al. |
| 2019/0111642 | A1 | 4/2019 | Chang et al. |
| 2020/0116934 | A1 | 4/2020 | Chang et al. |

FOREIGN PATENT DOCUMENTS

| | | |
|---|---|---|
| JP | 2007305895 A | 11/2007 |
| JP | 2008-296450 | 12/2008 |
| JP | 2009200345 A | 9/2009 |
| JP | 2010000754 A | 1/2010 |
| JP | 2010269466 A | 12/2010 |
| JP | 2011051328 A | 3/2011 |
| JP | 2011176321 A | 9/2011 |
| JP | 2012131229 A | 7/2012 |
| JP | 2012518562 A | 8/2012 |
| JP | 2012213984 A | 11/2012 |
| JP | 2013058517 A | 3/2013 |
| JP | 2013075379 A | 4/2013 |
| JP | 2016031952 A | 3/2016 |
| KR | 101005583 B1 | 1/2011 |
| TW | 201134647 A | 10/2011 |
| WO | 2013/153613 A1 | 10/2013 |

OTHER PUBLICATIONS

PCT International Search Report and Written Opinion in International Appln. No. PCT/US2018/056326, dated Feb. 15, 2019, 22 pages.
PCT International Search Report and Written Opinion in International Appln. No. PCT/US2019/056557, dated Jan. 10, 2020, 12 pages.
Extended European Search Report in Application No. 18766926.2, dated Feb. 19, 2020, 9 pages.
EP Extended European Search Report in Appln. No. 18868789.1, dated Feb. 18, 2021, 13 pages.
EP Office Action in European Appln. No. 18766926.2, dated Feb. 2, 2021, 8 pages.
EP Partial Supplementary European Search Report in Application No. 18868789.1, dated Nov. 18, 2020, 15 pages.
Office Action in Japanese Appln. No. 2019-550227, dated Nov. 29, 2021, 10 pages (with English translation).
Office Action in Taiwanese Appln. No. 107109177, dated Dec. 10, 2021, 35 pages (with English translation).

* cited by examiner

OPTICAL POLYMER FILMS AND METHODS FOR CASTING THE SAME

CROSS-REFERENCE TO RELATED APPLICATION

This application claims the benefit of the filing date of U.S. Provisional Application No. 62/472,380, filed on Mar. 16, 2017. The contents of U.S. Application No. 62/472,380 are incorporated herein by reference in their entirety.

TECHNICAL FIELD

This disclosure relates to optical polymer films.

BACKGROUND

Optical imaging systems, such as wearable imaging headsets, can include one or more eyepieces that present projected images to a user. Eyepieces can be constructed using thin layers of one or more highly refractive materials. As examples, eyepieces can be constructed from one or more layers of highly refractive glass, silicon, metal, or polymer substrates.

In some cases, an eyepiece can be patterned (e.g., with one or more light diffractive nanostructures), such that it projects an image according to a particular focal depth. For an example, to a user viewing a patterned eyepiece, the projected image can appear to be a particular distance away from the user.

Further, multiple eyepieces can be used in conjunction to project a simulated three-dimensional image. For example, multiple eyepieces—each having a different pattern—can be layered one atop another, and each eyepiece can project a different depth layer of a volumetric image. Thus, the eyepieces can collectively present the volumetric image to the user across three-dimensions. This can be useful, for example, in presenting the user with a "virtual reality" environment.

To improve the quality of a projected image, an eyepiece can be constructed such that unintended variations in the eyepiece are eliminated, or otherwise reduced. For example, an eyepiece can be constructed such that it does not exhibit any wrinkles, uneven thicknesses, or other physical distortions that might negatively affect the performance of the eyepiece.

SUMMARY

System and techniques for producing polymer film are described herein. One or more of the described implementations can be used to produce polymer film in a highly precise, controlled, and reproducible manner. The resulting polymer films can be used in a variety of variation-sensitive applications in which extremely tight tolerances on film dimensions are desired. For instance, the polymer films can be used in optical applications (e.g., as a part of eyepieces in an optical imaging system) in which material homogeneity and dimensional constraints on the order of optical wavelengths or smaller.

In general, polymer films are produced by enclosing a photocurable material (e.g., a photopolymer or light-activated resin that hardens when exposed to light) between two molds, and curing the material (e.g., by exposing the material to light).

However, during the curing process, the material may expand or contract within the molds. As a result, the film may become distorted (e.g., wrinkled, stretched, or compressed). Further, if the molds are not kept precisely parallel to each other, the film may have an uneven thickness across its extent. Accordingly, the film may be less suitable for use in variation-sensitive applications.

To improve the quality and consistency of the film, the position of the two molds can be precisely controlled, such that the molds are kept parallel to each other as the material is being cured. Further, during the curing process, the position of the molds can be adjusted to account for physical changes in the photocurable material. For example, if a particular photocurable material is known to contract at a particular rate, during the curing process, the two molds can be progressively drawn towards each other to account for the contraction. Thus, the space between the molds more closely matches the volume of the photocurable material throughout the curing processes. As a result, the photocurable material has a more even thickness, and is less likely to become distorted.

In some cases, the position of each mold can be detected using sensors (e.g., capacitive sensors and/or pressure sensors) mounted on or near the molds. Information from the sensors can be used to adjust the position of each mold relative to the other (e.g., using an actuable stage).

The quality and consistency of film can be further improved by reducing the presence of bubbles or trapped air between the two molds. In some cases, bubbles or trapped air can be reduced by depositing the photocurable material in a first mold, then drawing a second mold towards the first mold until the second mold contacts the photocurable material. The second mold can be skewed (e.g., rotated, bowed, and/or bent) relative to the first mold, such that any air between the two molds can escape as the molds are drawn together. Subsequently, the molds can be reoriented relative to one another (e.g., in a parallel orientation) prior to curing.

In general, in an aspect, a system for photocuring a photocurable material to form a polymer film includes a first chuck configured to support a first substantially planar mold having a first mold surface during use of the system, and a second chuck configured to support a second substantially planar mold having a second mold surface during use of the system. The second chuck includes a least a portion adjacent the second mold that is substantially transparent to one or more wavelengths of radiation suitable for photocuring the photocurable material. The system also includes an actuable stage coupled to the first chuck and/or the second chuck. The actuable stage is configured, during use of the system, to position the first chuck and/or the second chuck so that the first and second mold surfaces face each other and are separated by a gap. The system also includes a sensor arrangement for obtaining measurement information indicative of a distance between the first and second mold surfaces at each of at least three locations and/or a pressure between the first and second chucks at each of at least three locations during use of the system. The system also includes a control module communicatively coupled to the actuable stage. The control module is configured, during use of the system, to receive the measurement information and to control the gap between the first and second mold surfaces based on the received measurement information.

Implementations of this aspect can include one or more of the following features.

In some implementations, the second chuck can be formed from a material transparent to the one or more wavelengths of the radiation.

In some implementations, the one or more wavelengths of the radiation can include at least one of an ultraviolet wavelength or a visible wavelength.

In some implementations, the system can further include a radiation source. The radiation source can be configured, during use of the system, to direct the radiation to a region between the first mold surface and the second mold surface.

In some implementations, the first chuck can include a first substantially flat chuck surface. The second chuck can include a second substantially flat chuck surface facing the first chuck surface.

In some implementations, a flatness of the first chuck surface and a flatness of the second chuck surface each deviate from a flatness of an ideal flat surface by 100 nm or less.

In some implementations, at least one of the first chuck surface or the second chuck surface can be a polished or lapped surface.

In some implementations, the actuable stage can be configured, during use of the system, to translate the first chuck and/or second chuck with respect to at least one dimension.

In some implementations, the actuable stage can be configured, during use of the system, to translate the first chuck and/or second chuck with respect to three orthogonal dimensions.

In some implementations, the actuable stage can be configured, during use of the system, to rotate the first chuck and/or second chuck about at least one axis.

In some implementations, the actuable stage can be configured, during use of the system, to rotate the first chuck and/or second chuck about three orthogonal axes.

In some implementations, the sensor arrangement can include at least one capacitive sensor disposed on the first chuck and/or the second chuck.

In some implementations, the sensor arrangement can include a plurality of capacitive sensors disposed on the first chuck and/or the second chuck.

In some implementations, at least a portion of the first chuck and/or at least a portion of the second chuck can be electrically conductive.

In some implementations, the sensor arrangement can include at least one pressure sensor. Each pressure sensor assembly can be configured, during use of the system, to determine a pressure applied to a corresponding mechanical spacer disposed between the first chuck and the second chuck.

In some implementations, each mechanical spacer can be disposed on one of the first chuck, the second chuck, the first mold, or the second mold.

In some implementations, the sensor arrangement can include a plurality of pressure sensors. Each pressure sensor assembly can be configured, during use of the system, to determine a pressure applied to a corresponding mechanical spacer disposed between the first chuck and the second chuck In some implementations, the system can further include a vacuum assembly. The vacuum assembly can be configured, during use of the system, to apply vacuum pressure to the first mold to secure the first mold to the first chuck and/or apply vacuum pressure to the second mold to secure the second mold to the second chuck.

In some implementations, controlling the gap between the first and second mold surfaces can include positioning the first chuck and/or the second chuck such that the first mold surface is skewed with respect to the second mold surface, and subsequent to positioning the first chuck and/or the second chuck such that the first mold surface is skewed with respect to the second mold surface, moving the first chuck towards the second chuck.

In some implementations, positioning the first chuck and/or the second chuck such that the first mold surface is skewed with respect to the second mold surface can include positioning the first chuck and/or the second chuck such that an angular displacement between the first mold surface and the second mold surface is between approximately 1° and 10°.

In some implementations, controlling the gap between the first and second mold surfaces can include positioning the first chuck and/or the second chuck, such that the first mold surface and the second mold surface are substantially parallel.

In some implementations, controlling the gap between the first and second mold surfaces can include positioning the first chuck and/or the second chuck, such that an angular displacement between the first mold surface and the second mold surface is less than 10 µrad.

In some implementations, controlling the gap between the first and second mold surfaces can include moving the first chuck towards or away from the second chuck during photocuring of the photocurable material.

In some implementations, the first chuck can be moved towards or away from the second chuck continuously during photocuring of the photocurable material.

In some implementations, the first chuck can be moved towards or away from the second chuck intermittently during photocuring of the photocurable material.

In general, in another aspect, a method of casting a polymer film by photocuring a photocurable material can include dispensing the photocurable material onto a first surface of a first mold, positioning the first mold and a second mold such that the first surface and a second surface of the second mold are separated by a gap, obtaining measurement information indicative of a distance between the first and second molds at each of at least three locations and/or a pressure at each of at least three locations between the first and second molds during use of the system, and controlling the gap between the first and second molds surfaces based on the measurement information.

Implementations of this aspect can include one or more of the following features.

In some implementations, the method can further include directing, to the photocurable material, one or more wavelengths of radiation suitable for photocuring the photocurable material.

In some implementations, the one or more wavelengths of the radiation can include at least one of an ultraviolet wavelength or a visible wavelength.

In some implementations, the measurement information can be obtained using one or more capacitive sensors.

In some implementations, the measurement information can be obtained using three or more capacitive sensors.

In some implementations, obtaining the measurement information can include determining, using one or more pressure sensors, a pressure applied to each of one or more mechanical spacers disposed between the first and second molds and/or along a periphery of the first and second molds.

In some implementations, obtaining the measurement information can include determining, using three or more pressure sensors, a pressure applied to each of three or more mechanical spacers disposed between the first and second molds and/or along a periphery of the first and second molds.

In some implementations, the method can further include arranging the first mold relative to a second mold in a first configuration. In the first configuration, the first surface of the first mold can face the second surface of the second mold and can be skewed with respect to the second surface, and the photocurable material can contact the second surface of second mold.

In some implementations, in the first configuration, an angular displacement between the first surface of first mold and the second surface of second mold can be between approximately 1° and 10°.

In some implementations, in the first configuration, the second surface of second mold can be bowed with respect to the first surface.

In some implementations, the second surface of the second mold can be bowed by applying pressure to a central portion of the second mold.

In some implementations, in the first configuration, an angular displacement between the first surface of first mold and the second surface of second mold can be between approximately 1° and 10°, and the second surface of second mold can be bowed with respect to the first surface.

In some implementations, the method can further include, subsequent to arranging the first mold and the second mold in the first configuration, arranging the first mold and the second mold in a second configuration. In the second configuration, the first surface and the second surface can be substantially parallel.

In some implementations, the method can further include, subsequent to arranging the first mold and the second mold in the first configuration, arranging the first mold and the second mold in a second configuration. In the second configuration, an angular displacement between the first surface and the second surface can be less than 10 μrad.

In some implementations, the method can further include, subsequent to arranging the first mold and the second mold in the second configuration, directing, to the photocurable material, one or more wavelengths of radiation suitable for photocuring the photocurable material.

In some implementations, the method can further include, while directing the radiation to the photocurable material, decreasing or increasing the distance between the first and second molds over a period of time.

In some implementations, the distance between the first and second molds can be decreased or increased continuously over the period of time.

In some implementations, the distance between the first and second molds can be decreased or increased intermittently over the period of time.

One or more of the implementations described herein can provide various benefits. For example, in some cases, implementations described herein can enable the production of polymer film in a highly precise, controlled, and reproducible manner. The resulting polymer films can be used in a variety of variation-sensitive applications (e.g., as a part of eyepieces in an optical imaging system). Further, polymer films can be produced such that wrinkles, uneven thicknesses, or other unintended physical distortions are eliminated or otherwise reduced. This can be useful, for example, as the resulting polymer film exhibits more predictable physical and/or optical properties.

The details of one or more embodiments are set forth in the accompanying drawings and the description below. Other features and advantages will be apparent from the description and drawings, and from the claims.

DETAILED DESCRIPTION

System and techniques for producing polymer film are described herein. One or more of the described implementations can be used to produce polymer film in a highly precise, controlled, and reproducible manner. The resulting polymer films can be used in a variety of variation-sensitive applications (e.g., as a part of eyepieces in an optical imaging system).

In some implementations, polymer films can be produced such that wrinkles, uneven thicknesses, or other unintended physical distortions are eliminated or otherwise reduced. This can be useful, for example, as the resulting polymer film exhibits more predictable physical and/or optical properties. For example, polymer films produced in this manner can diffract light in a more predictable and consistent manner, and thus, may be more suitable for use a high resolution optical imaging system. In some cases, optical imaging systems using these polymer films can produce sharper and/or higher resolution images than might otherwise be possible with other polymer films.

Figure 1:
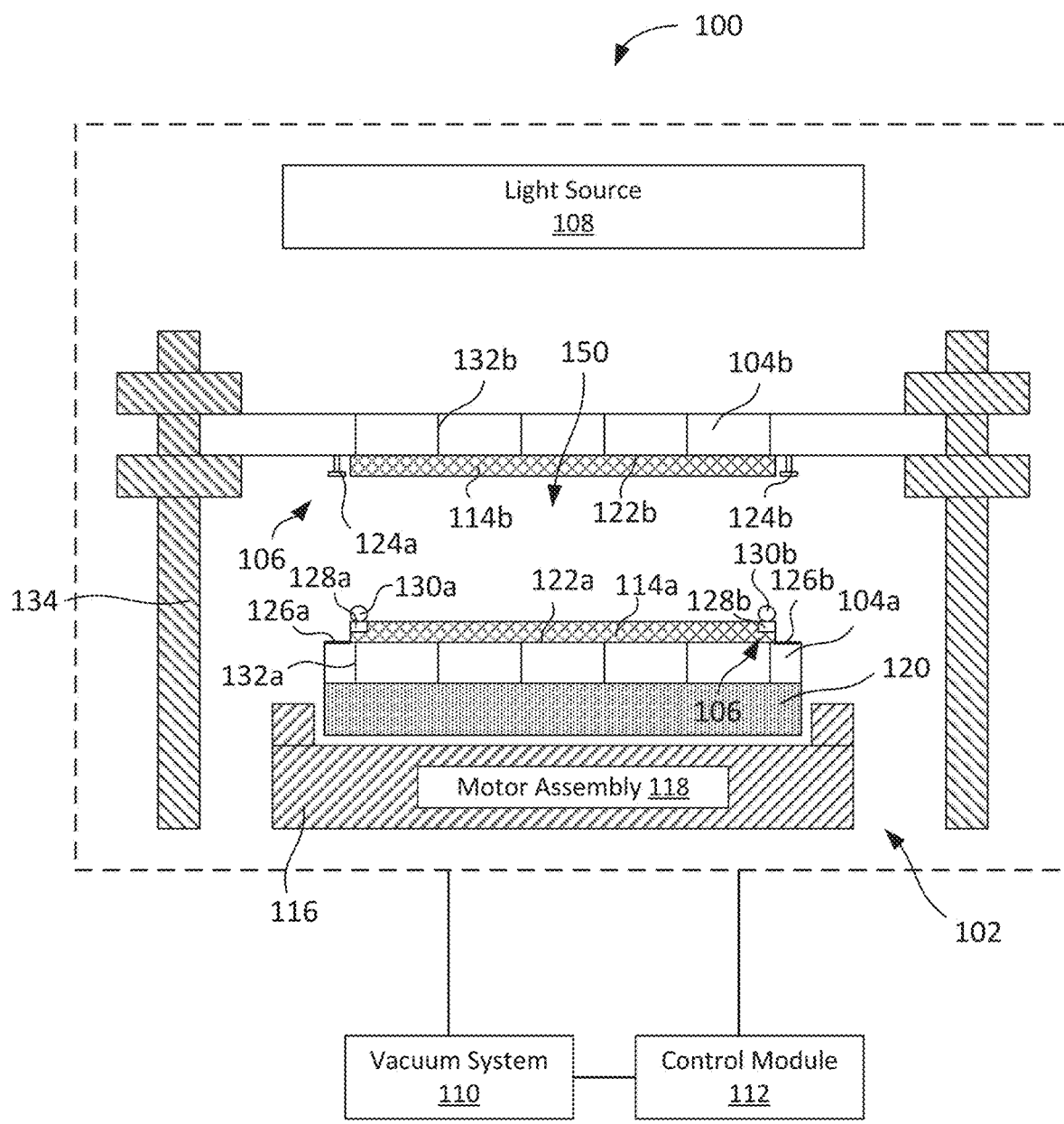
FIG. 1 is a diagram of an example system for producing polymer film.

An example system 100 for producing polymer film is shown in FIG. 1. The system 100 includes an actuable stage 102, chucks 104a and 104b, a sensor assembly 106, light source 108, a vacuum system 110, and a control module 112.

During operation of the system 100, two molds 114a and 114b are secured to the chucks 104a and 104b, respectively. A photocurable material (e.g., a photopolymer or light-activated resin that hardens when exposed to light) is deposited into the mold 114a. The mold 114a is moved into proximity with mold 114b, such that the curable material is enclosed by the molds 114a and 114b. The curable material is then cured (e.g., by exposing the curable material to light from the light source 108), forming a thin film having one or more features defined by the molds 114 and 114b. After the curable material has been cured, the mold 114a is moved away from the mold 114b, and the film is extracted.

The actuable stage 102 is configured to support the chuck 104a, manipulate the chuck 104a in one or more dimensions, and control a gap region 150 between the chucks 104a and 104b.

For instance, in some cases, the actuable stage 102 can translate the chuck 104a along one or more axes. As an example, the actuable stage 102 can translate the chuck 104a along an x-axis, a y-axis, and/or a z-axis in a Cartesian coordinate system (i.e., a coordinate system having three orthogonally arranged axes). In some cases, the actuable stage 102 can rotate or tilt the chuck 104a about one or more axes. As an example, the actuable stage 102 can rotate the chuck 104a along an x-axis (e.g., to "roll" the chuck 104a), a y-axis (e.g., to "pitch" the chuck 104a), and/or a z-axis (e.g., to "yaw" the chuck 104a) in a Cartesian coordinate system. Translation and/or rotation with respect to one or more other axes are also possible, either in addition to or instead of those described above.

In some cases, the actuable stage 102 can manipulate the chuck 104a according to one or more degrees of freedom (e.g., one, two, three, four, or more degrees of freedom). For instance, the actuable stage 102 can manipulate the chuck 104a according to six degrees of freedom (e.g., translation along an x-axis, y-axis, and z-axis, and rotation about the x-axis, y-axis, and z-axis). Manipulation according to one or more other degrees of freedom is also possible, either in addition to or instead of those described above.

In some cases, the actuable stage 102 can include one or more motor assemblies configured to manipulate the chuck 104a and control the gap region 150. For example, the actuable stage 102 can include a base portion 116 containing a motor assembly 118, and an articulating portion 120 configured to support the chuck 104. The motor assembly 118 can be configured to manipulate the articulating portion 120 using the motor assembly 118, thereby repositioning and/or reorienting the chuck 104a.

In the example shown in FIG. 1, the actuable stage 102 is mechanically coupled to the chuck 104a, and controls the gap region 150 by manipulating the chuck 104a. Further, the chuck 104b is held stationary (e.g., by supports 134). In practice, however, the chuck 104b also can be manipulated to control the gap region 150. For example, in some implementations, the system 100 can include a second actuable stage configured to manipulate the chuck 104b, either instead or in combination with the actuable stage 102 shown in FIG. 1.

The chucks 104a and 104b are configured to provide a stable mounting surface for the molds 114a and 114b, respectively. In some cases, the chucks 104a and 104b can be configured such that the molds 114a and 114b can be physically mounted to the chucks 104a and 104b, respectively, through a vacuum mechanism. As an example, as shown in FIG. 1, the chuck 104a can define a series of vacuum channels 132a that extend through the chuck 104a, and the chuck 104b can define a series of vacuum channels 132b that extend through the chuck 104b. The vacuum channels 132a and 132b can be coupled to a vacuum system 110 configured to generate a total or partial vacuum within the channels 132a and 132b. This results in a suction pressure that secures the molds 114a and 114b to the chucks 104a and 104b, respectively. The vacuum system 110 can be configured to selectively generate vacuum in the channels 132a and 132b, such that the molds 114a and 114b can be reversibly mounted to dismounted from the chucks 104a and 104b.

In some cases, the surfaces of chucks 104a and 104b that face each other can each be substantially flat. For example, the chuck 104a can include a substantially flat surface 122a, and the chuck 104b can have substantially flat surface 122b, upon which a respective mold can be mounted. A substantially flat surface can be, for example, a surface that deviates from a flatness of an ideal flat surface (e.g., a perfectly flat surface) by 100 nm or less. In some cases, the surface 122a and/or the surface 122b can be polished or lapped such that they are substantially flat. A substantially flat surface can be beneficial, for example, as it enables the molds 114a and 114b to be mounted in a consistent manner to the chucks 104a and 104b, such that they can be positioned relative to one another with a high degree of precision by the actuable stage 102.

The molds 114a and 114b collectively define an enclosure for the photocurable material. For example, the molds 114a and 114b, when aligned together, can define a hollow mold region, within which the photocurable material can be deposited and cured into a film. The molds 114a and 114b can also define one or more structures in the resulting film. For example, the molds 114a and 114b can include one or more protruding structures that impart a corresponding channel in the resulting film. As another example, the molds 114a and 114b can include one or more channels that impart a corresponding protruding structure in the resulting film. In some cases, the molds 114a and 114b can define a particular shape and pattern, such that the resulting film is suitable for use as an eyepiece in an optical imaging system (e.g., such that the film has one or more light diffractive nanostructures that impart particular optical characteristics to the film).

The sensor assembly 106 is configured to determine the position and/or orientation of the chucks 104a and 104b relative to one another, such that the system 100 can precisely control the relative position and/or orientation of the chucks 104a and 104b and control the gap region 150. As an example, the sensor assembly 106 can determine whether the surfaces 122a and 122b are parallel to each other. As another example, the sensor assembly 106 can determine that the surfaces 122a and 122b are inclined with respect to each other, and determine the axis or axes of inclination. As another example, the sensor assembly 106 can determine the relative distance at one or more locations along the surfaces 122a and 122b.

In some cases, the sensor assembly 106 can determine the orientation of the chucks 104a and 104b relative to one another by measuring the distance between the surfaces 122a and 122b at three or more locations along the surfaces 122a and 122b. For example, the sensor assembly 106 can determine a first distance between a point $A_1$ and a point $A_2$ on chucks 104a and 104b, respectively, a second distance between a point $B_1$ and a point $B_2$ on chucks 104a and 104b, respectively, and a third distance between a point $C_1$ and a point $C_2$ on chucks 104a and 104b, respectively. If the set of points $A_1$, $B_1$, and $C_1$ and the set of points $A_2$, $B_2$, and $C_2$ are each non-linear, then the first, second, and third distances can be used to determine the orientation of the surfaces 122a and 122b relative to one another. Further, although an example having three pairs of points is described, in some cases, the sensor assembly 106 can determine the distance between any number of point pairs (e.g., one pair of points, two pairs of points, three pairs of points, or more), and the pairs of points can be arranged in any orientation (e.g., linearly positioned, non-linearly positioned, or according to any other pattern).

In some cases, a distance between the surfaces 122a and 122b can be measured using a capacitive sensor assembly. For example, FIG. 1 shows a sensor assembly 106 having a capacitive sensor 124a mounted to the surface 122b of the chuck 104b. The area 126a of the surface 122a facing the capacitive sensor 124a is electrical conductive (e.g., the chuck 104b can be either entirely composed of an electrically conductive material, or composed of an electrically conductive material at least along the area 126a). The capacitive sensor 124a measures the capacitance, and based on the measured capacitance, determines the distance between the surfaces 122a and 122b at this first location. Similarly, FIG. 1 also shows a capacitive sensor 124b mounted to the surface 122b of the chuck 104b. The area 126b of the surface 122a facing the capacitive sensor 124a is also electrical conductive (e.g., the chuck 104b can be either entirely composed of an electrically conductive material, or composed of an electrically conductive material at least along the area 126b). Likewise, the capacitive sensor 124b measures the capacitance, and based on the measured capacitance, determines the distance between the surfaces 122a and 122b at this second location. Although two capacitive sensors 124a and 124b are shown for illustrative purposes in FIG. 1, in practice, a system 100 can include any number of capacitive sensors, each configured to measure a distance between the chucks 104a and 104b at a particular location.

Although FIG. 1 depicts the capacitive sensors 124a and 124b as being mounted to the chuck 104b, this need not be the case. For example, in some cases, one or more capacitive sensors can be mounted on the chuck 104a, and each of those capacitive sensors can have a corresponding electrically conductive area on the surface 122b of chuck 104b facing it. Further, in some cases, capacitive sensors can be distributed across both the chuck 104a and 104b. Further still, in some cases, one or more capacitive sensors can be distributed across one or both of the molds 114a and 114b, and have corresponding electrically conductive areas on the molds 114a and 114b facing it.

In some cases, the distance between the surfaces 122a and 122b can be measured using a pressure sensor assembly. For example, FIG. 1 shows a sensor assembly 106 having a pressure sensor 128a mounted to the mold 114a and beneath a mechanical spacer 130a. When the mold 114a and 114b are brought together, the mechanical spacer 130a presses against the mold 114b, causing a pressure to be applied to the mechanical spacer 130a. The pressure sensor 128a measures the pressure applied to the mechanical spacer 130a, and based on the measured pressure, determines the distance between the surfaces 122a and 122b at this first location. Similarly, FIG. 1 also shows a pressure sensor 128b mounted to the mold 114a and beneath a mechanical spacer 130b. The pressure sensor 128b measures the pressure applied to the mechanical spacer 130b (e.g., due to the contact between the mechanical spacer 130b and the mold 114b), and based on the measured pressure, determines the distance between the surfaces 122a and 122b at this second location. Although two pressure sensors 128a and 128b (at corresponding mechanical spacers 130a and 130b) are shown for illustrative purposes in FIG. 1, in practice, a system 100 can include any number of pressure sensors and/or mechanical spacers, each configured to measure a distance between the chucks 104a and 104b at a particular location. Further, a system 100 can include one or more capacitive sensors and one or more pressure sensors in combination to measure the distance between the chucks 104a and 104b.

Although FIG. 1 depicts the pressure sensors 128a and 128b and mechanical spacers 130a and 130b as being mounted to the mold 114a, this need not be the case. For example, in some cases, one or more pressure sensors and/or mechanical spacers can be mounted on the mold 114b. Further, in some cases, pressure sensors and/or mechanical spacers can be distributed across both the mold 114a and the mold 114b. Further still, in some cases, one or more pressure sensors and/or mechanical spacers can be distributed across one or both of the chucks 104a and 104b.

The light source 108 is configured to generate one or more wavelengths of radiation suitable for photocuring the photocurable material. The one or more wavelengths can differ, depending on the type of photocurable material used. For example, in some cases, a photocurable material (e.g., a UV-curable liquid silicone elastomer such as Poly(methyl methacrylate) or Poly(dimethylsiloxane)) can be used, and correspondingly the light source can be configured to generate radiation having a wavelength in a range from 315 nm to 430 nm to photocure the photocurable material. In some cases, one or more of the chucks 104a and 104b and molds 114a and 114b can be transparent, or substantially transparent to the wavelengths of radiation suitable for photocuring the photocurable material, such that radiation from the light source 108 can pass through the chuck 104a, the chuck 104b, the mold 114a, and/or the molds 114b and impinge upon the photocurable material.

The control module 112 is communicatively coupled to the actuable stage 102 and the sensor assembly 106, and is configured to control the gap region 150 based on measurements received from the sensor assembly 106. For instance, the control module 112 can receive measurements regarding gap region 150 (e.g., the distance between the chuck 104a and 104b at one or more locations) from the sensor assembly 106, and reposition and/or reorient one or both of the chucks 104a and 104b in response.

As an example, based on measurements received from the sensor assembly 106, the control module 112 can determine that the chucks 104a and 104b are misaligned (e.g., the surfaces 122a and 122b are not parallel to each other). This misalignment might also result in a misalignment between the molds 114a and 114b. If the photocurable material is photocured when the molds 114a and 114b are misaligned, the resulting film may exhibit wrinkles, uneven thickness, or other physical distortions that might negatively affect the performance of the film in its intended application. Accordingly, the control module 112 can correct the misalignment (e.g., by repositioning the chuck 104a and/or 104b such that the surfaces 122a and 122b are substantially parallel to each other).

As an example, based on measurements received from the sensor assembly 106, the control module 112 can determine that the chucks 104a and 104b are improperly spaced (e.g., the surfaces 122a and 122b are too close or too distant from each other). This improper spacing might also result in an incorrect spacing between the molds 114a and 114b. If the photocurable material is photocured when the molds 114a and 114b are improperly spaced, the resulting film may have dimensions that deviate from their intended dimensions, which might negatively affect the performance of the film in its intended application. Accordingly, the control module 112 can correct the spacing (e.g., by repositioning the chuck 104a and/or 104b such that the surfaces 122a and 122b are properly spaced from one another).

In some cases, the photocurable material can expand or contract during the photocuring process. If the position of the molds 114a and 114b are not adjusted during photocuring, the resulting film might be distorted (e.g., wrinkled, stretched, compressed, or otherwise distorted). To improve the quality of the film, the control module 112 can adjust the gap region 150 during the photocuring process (e.g., while the light source 108 is generating radiation and/or between sessions of radiation), such that the space between the molds 114a and 114b is adjusted to account for expansion and/or contraction. In some cases, the control module 112 can adjust the gap region continuously during the photocuring process. In some cases, the control module 112 can adjust the gap region intermittently during the photocuring process.

The manner in which the gap region 150 is adjusted can differ, depending on the implementation. In some cases, the amount and rate of material expansion or contraction can be experimentally determined based on various factors, such as the type of photocurable material used, the dimensions of the mold region, the type of radiation used, the strength of that radiation, and so forth. Accordingly, the control module 112 can be configured to expand and/or contract the gap region 150 at a particular empirically determined amount and rate, such that the material expansion and contraction is accounted for (e.g., by contracting the gap region when the material contracts, and expanding the gap region when the material expands). This can beneficial, for example, in reducing or eliminating distortions in the resulting film, thereby increasing its quality.

In some cases, the control module 112 can be configured to expand and/or contract the gap region 150 by moving one or both chucks relative to one another. In some cases, the gap region can be changed continuously over a period of time (e.g., continuously during the photocuring process), or intermittently over the period of time (e.g., intermittently during the photocuring process).

In some cases, the control module 112 can also be communicatively coupled to and control the vacuum system 110 and/or the light source 108. For example, the control module 112 can be communicatively coupled to the vacuum system 110, and can control the operation of the vacuum system 110 (e.g., to selectively apply vacuum pressure to reversibly secure the molds 114a and 114b to the chucks 104a and 104b, respectively). As another example, the control module 112 can be communicatively coupled to the light source 108, and can control the operation of the light source 108 (e.g., to selectively apply radiation as a part of the photocuring process).

FIGS. 2A-2F depict an example photocuring process using the system 100.

Figure 2A:
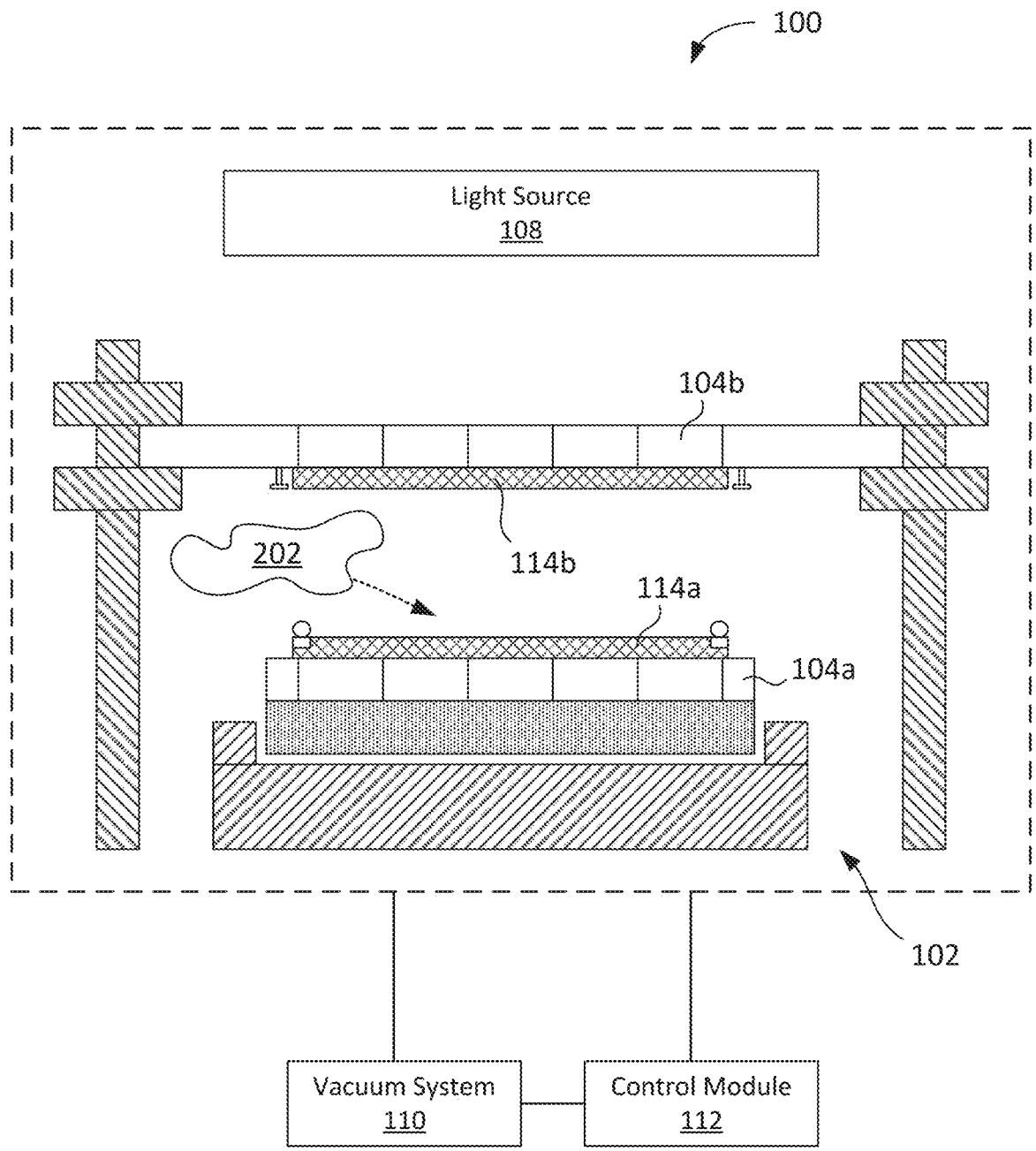
FIGS. 2A-2F are diagrams of an example photocuring process using the system shown in FIG. 1.

As shown in FIG. 2A, a mold 114a is mounted to the chuck 104a (e.g., through a vacuum pressure applied by the vacuum system 110), and a corresponding mold 114b is mounted to the chuck 104b (e.g., through a vacuum pressure applied by the vacuum system 110). A portion of photocurable material 202 is deposited into the mold 114.

After the photocurable material 202 is deposited into the mold 114, the system can perform a "pre-wetting" procedure. During the pre-wetting procedure, the chuck 104a and the mold 114a are positioned in proximity to the chuck 104b and the mold 114b, such that such that the photocurable material 202 contained within the mold 114a contacts the mold 114b. Thus, the mold 114b is "wetted" by the photocurable material 202. Further, as the molds 114a and 1114b are drawn together, one mold (e.g., mold 114b) is skewed relative to the other (e.g., mold 114a). Due to this skewed orientation, air is less likely to be trapped between the mold 114a and 114b when the molds 114a and 114b are brought together, thereby eliminating or otherwise reducing the presence of bubbles or trapped air. The chucks 104a and 104b can be subsequently adjusted such that they are parallel to one another, and the molds 114a and 114b are no longer skewed.

Figure 2B:
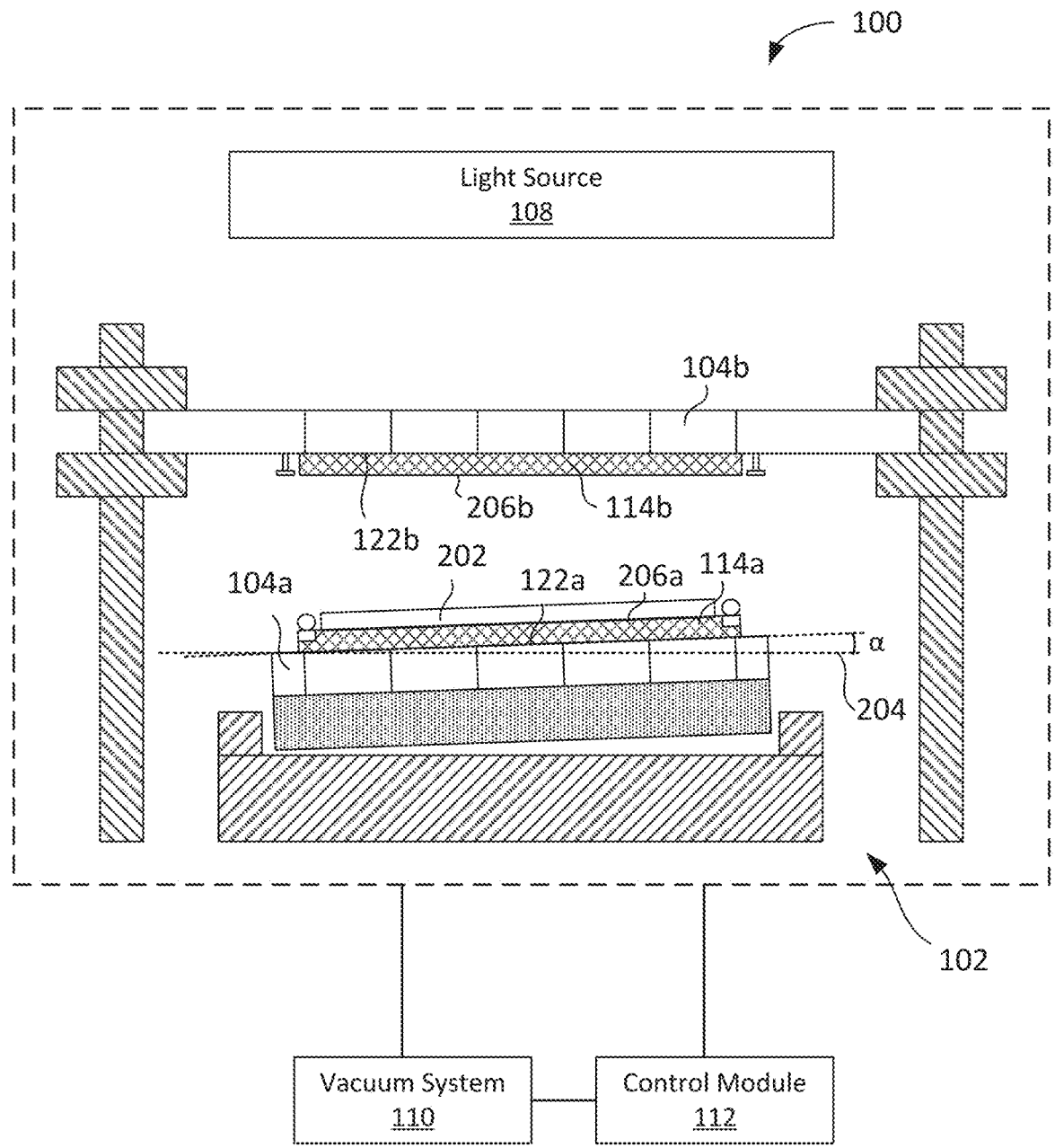
Figure 2C:
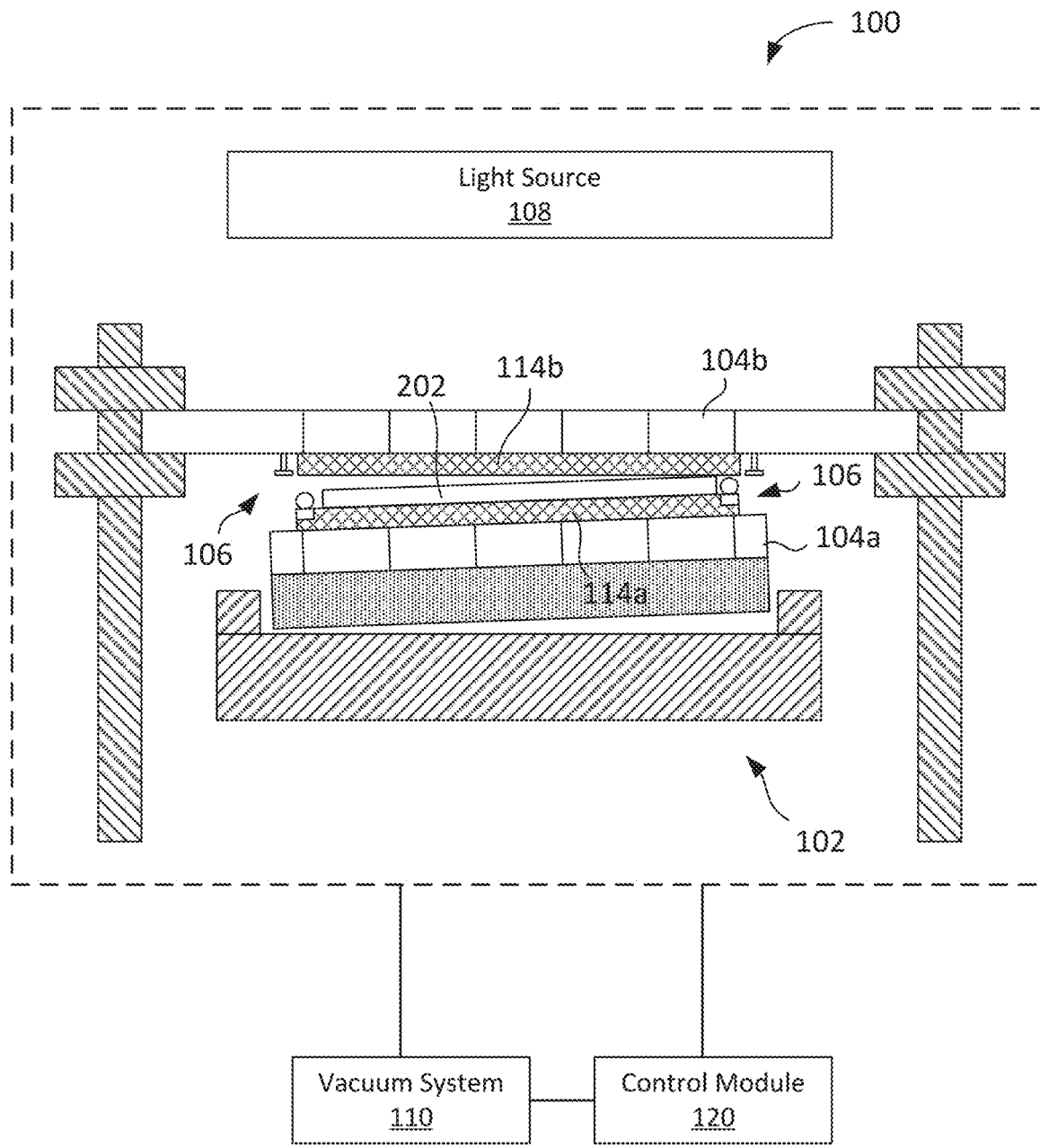
Figure 2D:
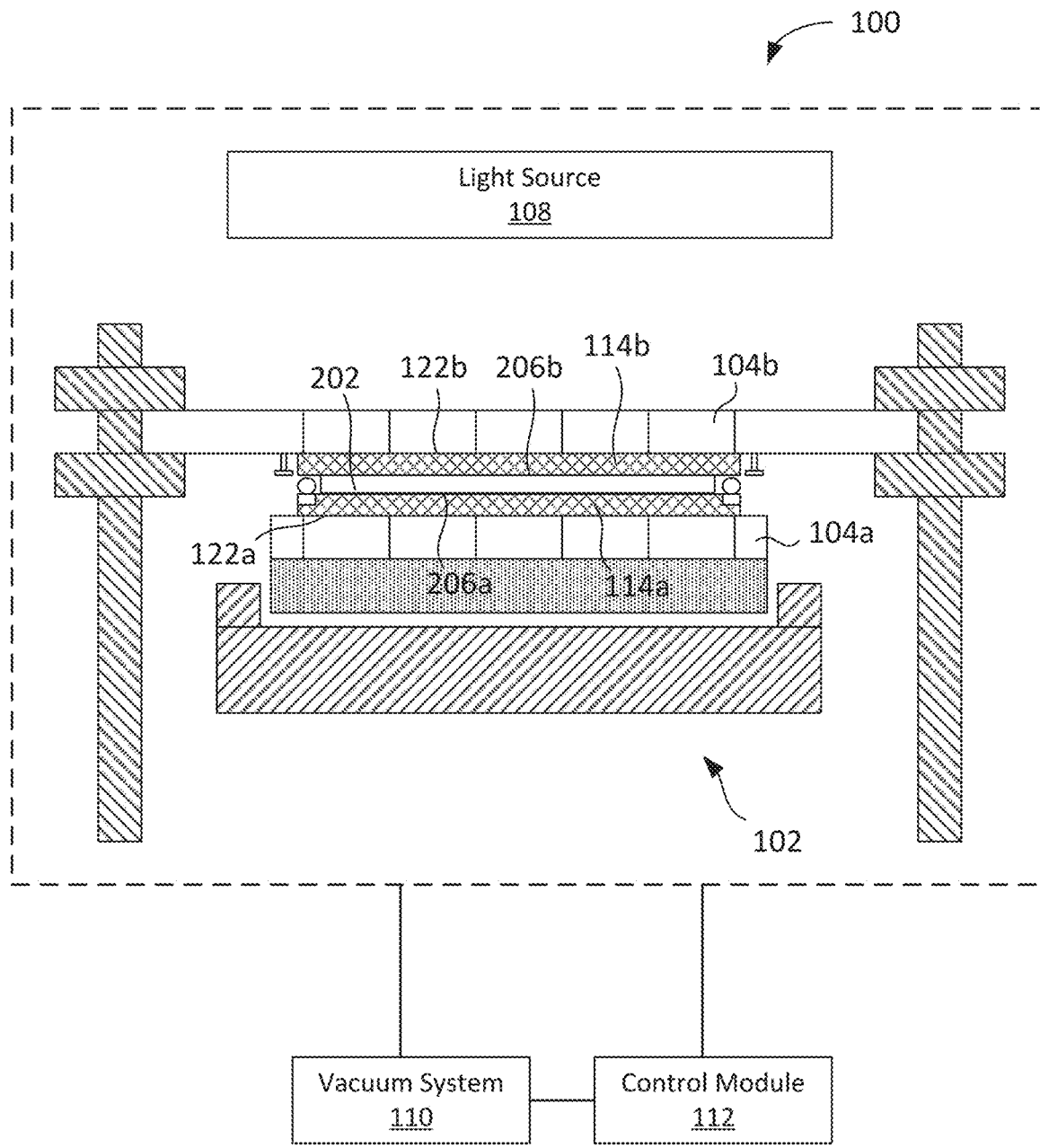

An example pre-wetting procedure is shown in FIGS. 2B-2D. As shown in FIG. 2B, the actuable stage 102 skews the chuck 104a relative to the chuck 104b (e.g., by rotating the chuck 104a), such that the surface 122a of the chuck 104a is inclined with respect the surface 122b of the chuck 104b by an angle α. Accordingly, a mold surface 206a of the mold 114a (e.g., a top surface of the mold 114a contacting photocurable material 202) and a mold surface 206b of the mold 114b (e.g., the bottom surface of the mold 114b that will contact photocurable material 202) are skewed relative one another.

For ease of illustration, a line 204 parallel of the surface 122b is shown in FIG. 2B. In some cases, the angle a can be between approximately 1° and 10°.

As shown in FIG. 2C, the actuable stage 102 moves the chuck 104a upward, such that the mold 114a and mold 114b are in proximity to one another. In this position, the mold 114a and mold 114b are oriented such that the photocurable material 202 contained within the mold 114a contacts the mold 114b. As described above, the relative position and/or orientation of the chucks 104a and 104b (and/or the relative position and/or orientation of the molds 114a and 114b) can be determined using a sensor assembly 106 and the control module 112).

As shown in FIG. 2D, the actuable stage 102 repositions the chuck 104a relative to the chuck 104b, such that the surface 122a of the chuck 104a is substantially parallel to the surface 122b of the chuck 104b, and such that the mold surface 206a of the mold 114a is substantially parallel to the mold surface 206b of the mold 114b. In some cases, an angle between the two surfaces 122a and 122b, and/or the angle between the two mold surfaces 206a and 206b, can be less than 1°. In some cases, an angle of 2" of arc or less (e.g., 10 μrad or less) may be particularly suitable for fabricating optical polymer films (e.g., 0.1 μm or thinner optical polymer films used in eyepieces).

As described above, by first skewing the chuck 104a relative to the chuck 104b, then positioning the chuck 104a such that such that the photocurable material 202 contained within the mold 114a contacts the mold 114b, and subsequently adjusting the chuck 104a and 104b such that they are parallel to each other, the occurrence of bubbles trapped within the molds 114a and 114b can be eliminated or otherwise reduced. For instance, in the example depicted in FIG. 2C, bubbles between the molds 114a and 114b will travel towards the left and exit the mold region rather than being trapped between the molds. Thus, the resulting film is less like to have distortions and other structural defects.

Figure 2E:
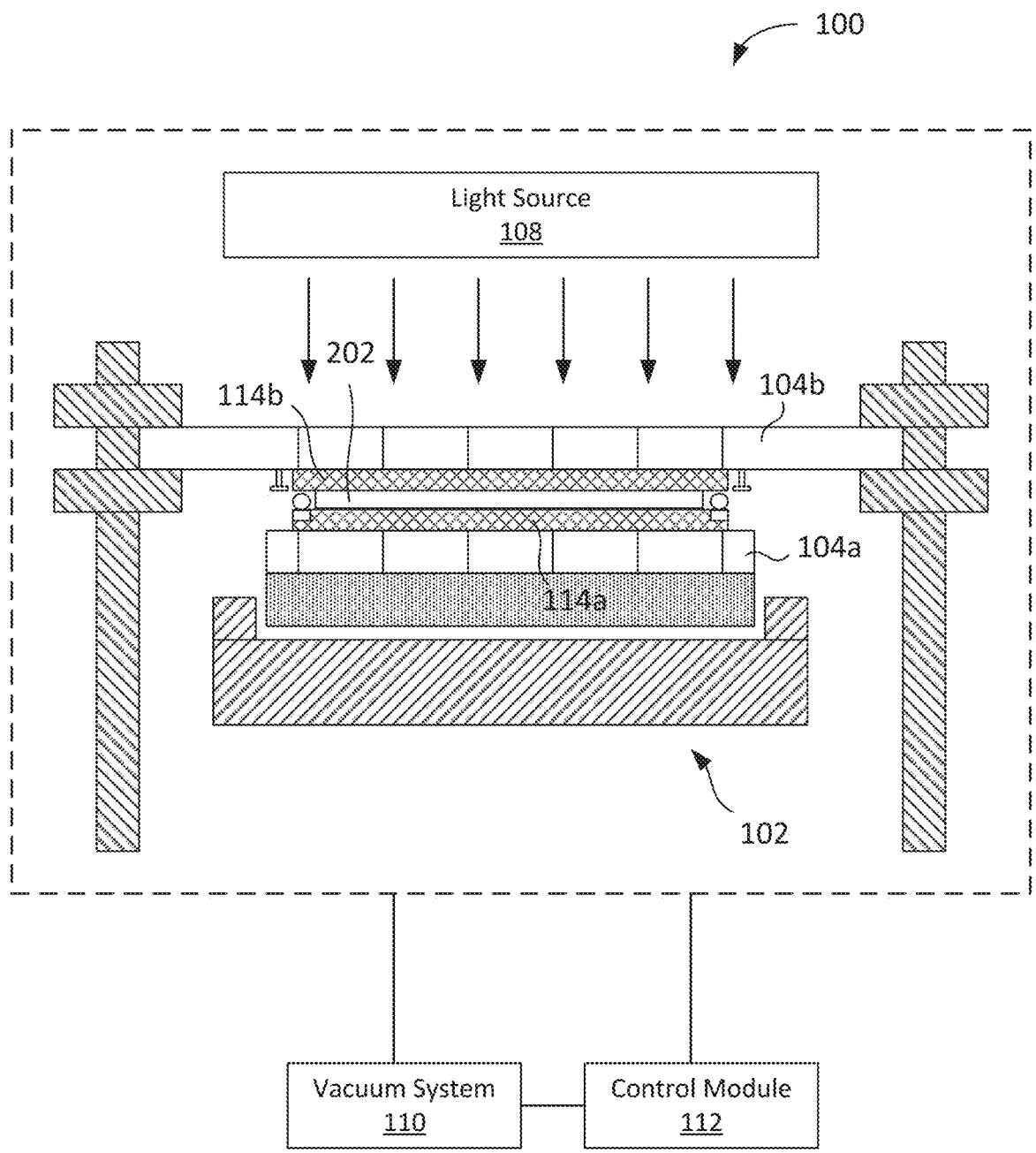

As shown in FIG. 2E, the light source 108 generates one or more wavelengths of radiation suitable for photocuring the photocurable material, and directs it to the photocurable material 202 in the mold region between the molds 114a and 114b. This hardens the photocurable material, resulting in a film.

Figure 2F:
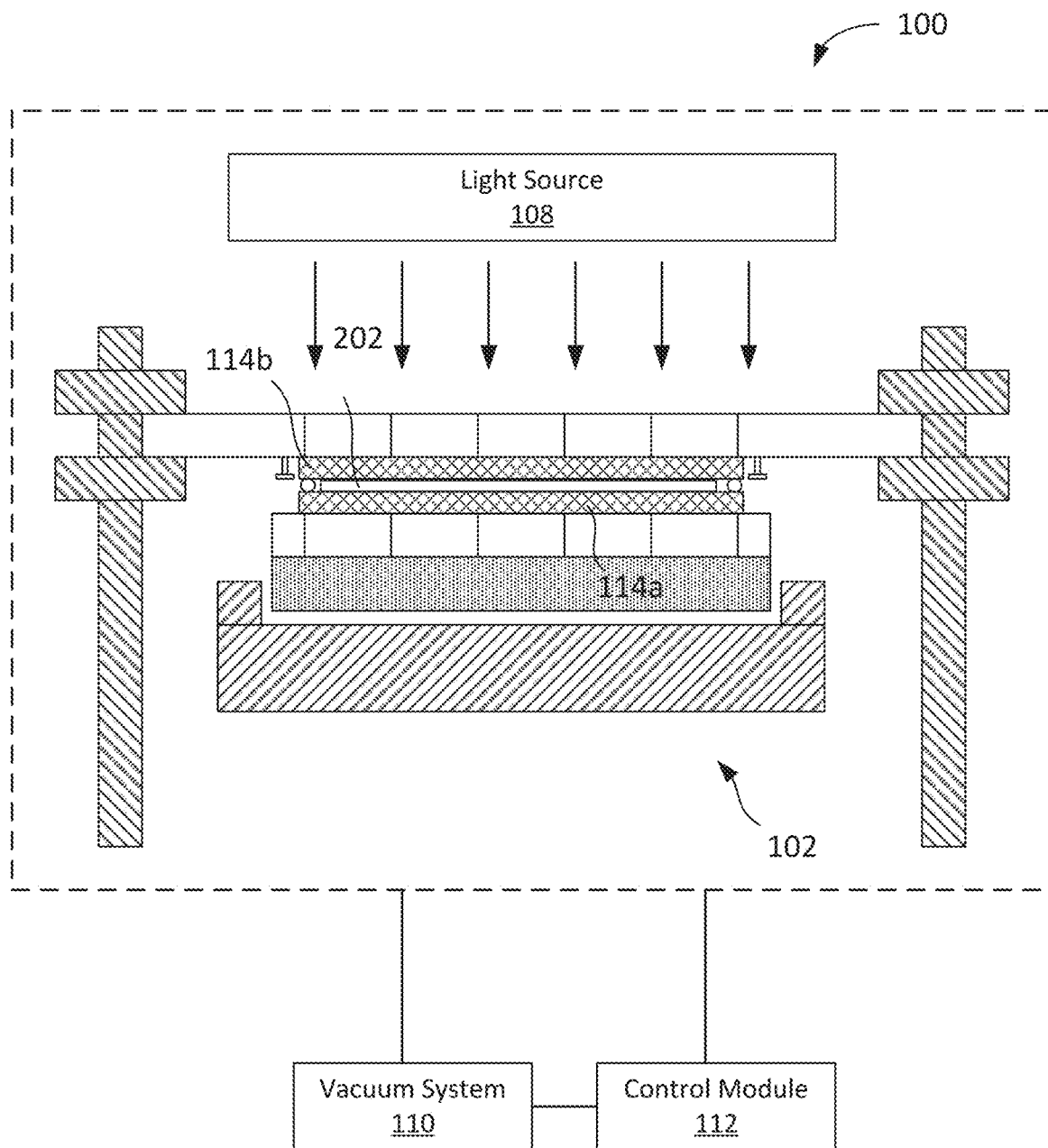

As described above, the photocurable material can expand or contract during the photocuring process. To improve the quality of the film, the control module 112 can adjust the gap region during the photocuring process (e.g., while the light source 108 is generating radiation and/or between sessions of radiation), such that the space between the molds 114a and 114b is adjusted to account for expansion and/or contraction. For example, as shown in FIG. 2F, the mold 114a can be moved nearer the mold 114b during photocuring to account for contractions in the photocurable material during the photocuring process. Although FIG. 2F depicts mold 114a moving near the mold 114b, this need not be the case. In some implementations, the mold 114b can also move, either instead of or in addition to mold 114a.

As noted above, the amount and rate of material expansion or contraction can be experimentally determined based on various factors, and the control module 112 can be configured to expand and/or contract the gap region at a particular empirically determined amount and rate, such that the material expansion and contraction is accounted for.

As an example, an experiment can be conducted by curing a specific photocurable material specific conditions. The specific conditions could pertain to, for instance, the particular amount of photocurable material used in the photocuring process, the particular shape and size of the molds used to cure the material, the spectral composition and/or the intensity of the radiation used to cure the material, the length of time in which the photocurable light is exposed to the radiation, and/or any other factors that could influence the photocuring process. As the photocurable material is cured, the photocurable material is monitored to determine any changes in volume. These measurements can be obtained at discrete time points throughout the photocuring process (e.g., once every second, once every minute, or according to some other pattern), and/or obtained continuously or substantially continuously over the course of the photocuring process, to determine the expansion and/or contraction of the photocurable material over time.

Subsequently, the control module 112 can be configured to expand and/or contract the gap region based on these time dependent measurements. For example, if the same photocurable material is to be cured using the same parameters as those in the experiment, the control module 112 can expand and/or contract the gap region in a time-dependent manner, such that the volume of the gap region is similar to that of the photocurable material.

Further, multiple experiments can be conducted using the same photocurable material and parameters (e.g., so that the expansion and/or contraction of the photocurable material can be estimated more accurately). Further, experiments can be conducted using a different photocurable material and/or different parameters (e.g., to estimate the expansion and/or contraction of different photocurable materials and/or under different conditions).

In the example process shown in FIG. 2A-E, the molds are skewed relative to one another by rotating one chuck relative to the other. However, this need not be the case. In some implementations, the molds can be skewed relative to one another by bending or bowing one or more of the molds.

As an example, FIGS. 3A -3F depict another example photocuring process using the system 100.

Figure 3A:
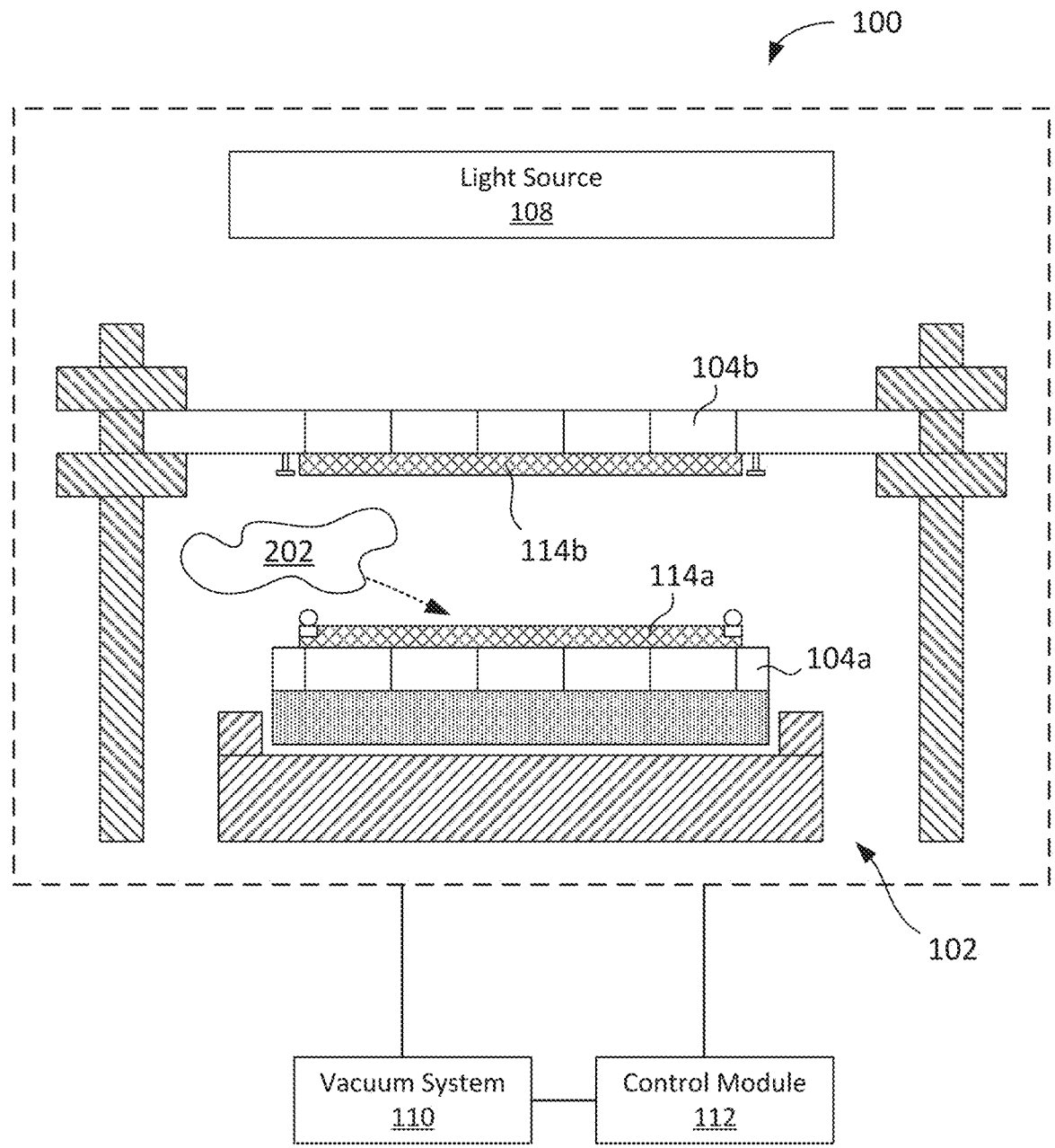
FIGS. 3A-3F are diagrams of another example photocuring process using the system shown in FIG. 1.

As shown in FIG. 3A, a mold 114a is mounted to the chuck 104a (e.g., through a vacuum pressure applied by the vacuum system 110), and a corresponding mold 114b is mounted to the chuck 104b (e.g., through a vacuum pressure applied by the vacuum system 110). A portion of photocurable material 202 is deposited into the mold 114.

After the photocurable material 202 is deposited into the mold 114, the system can perform a "pre-wetting" procedure in which the mold 114a is skewed relative to the mold 114b (e.g., by bending or bowing the mold 114a), and positioned in proximity to the mold 114b such that such that the photocurable material 202 contained within the mold 114a contacts the mold 114b. The mold 114a and 114b can subsequently be adjusted such that they are parallel to one another or unbent relative to one another. As above, this pre-wetting process can be useful, for example, as it can eliminate or otherwise reduce the presence of bubbles or trapped air when the molds 114a and 114b are brought together.

Figure 3B:
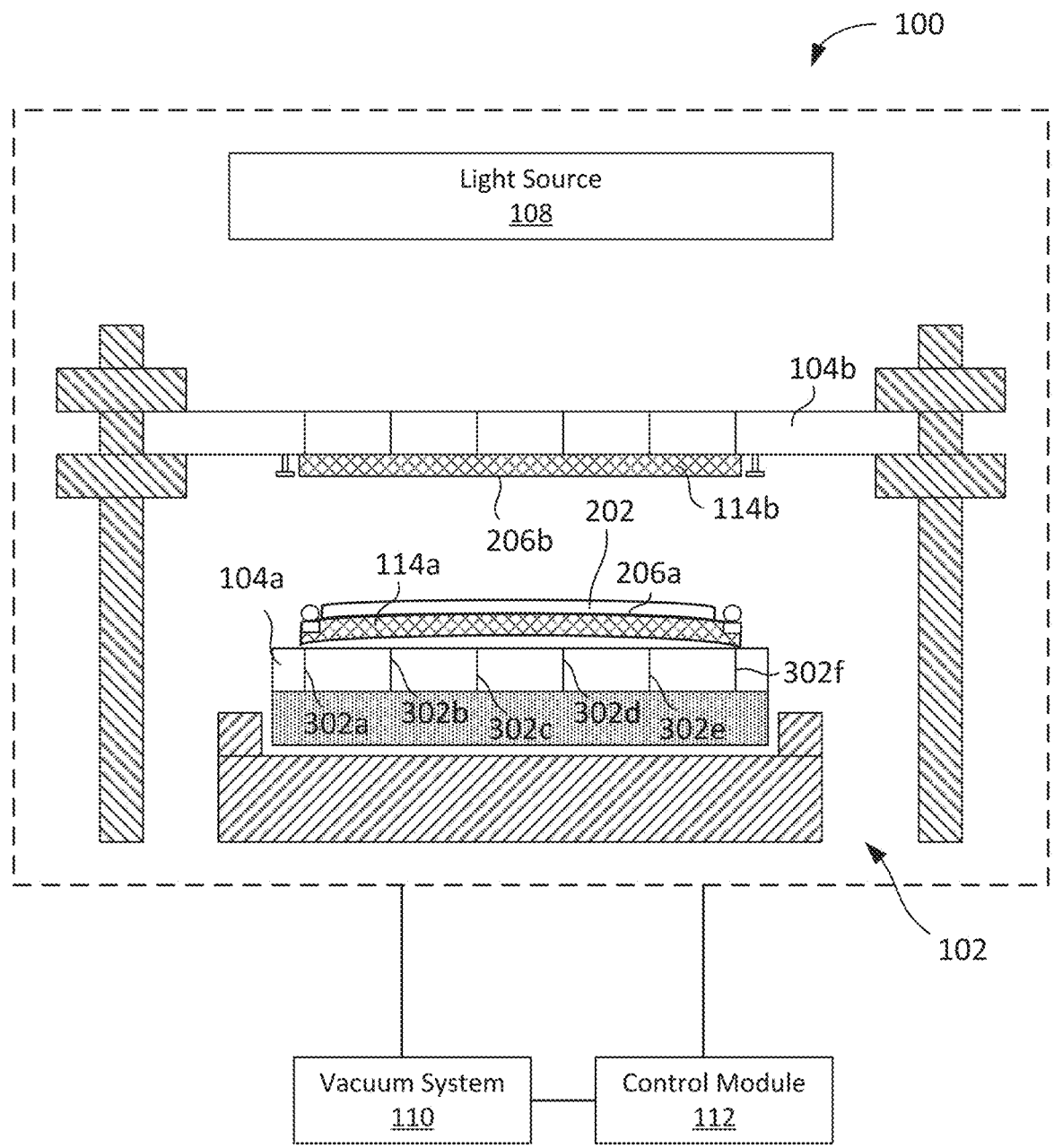
Figure 3C:
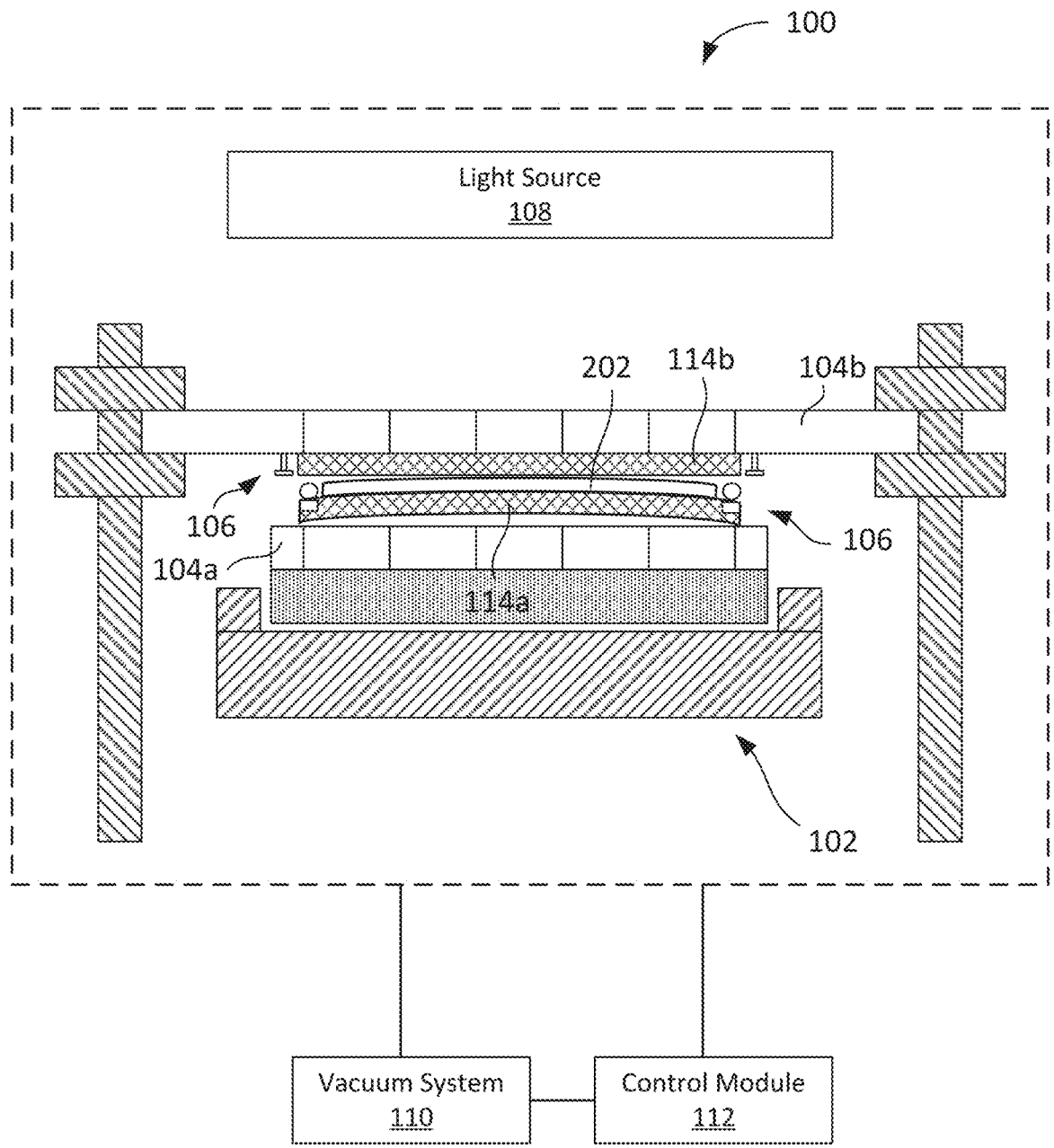
Figure 3D:
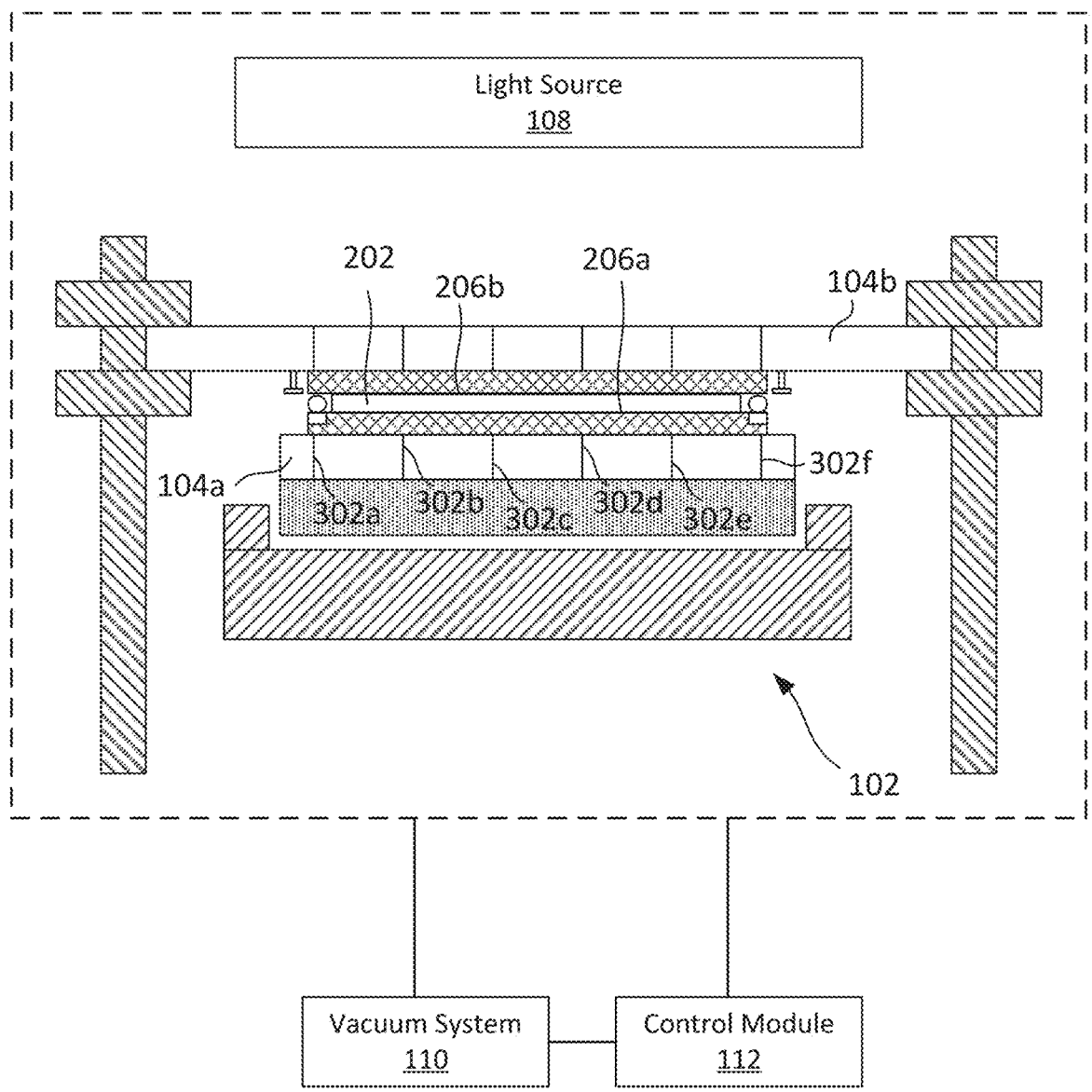

An example pre-wetting procedure is shown in FIGS. 3B-3D. As shown in FIG. 3B, the actuable stage 102 skews the mold 114a relative to the mold 114b (e.g., by bowing or bending the mold 114a), such that the mold surface 206a of the mold 114a is not parallel with the mold surface 206b of the mold 114b. In some cases, the mold 114a can be bent such that one portion of the mold 114a (e.g., a center portion of surface 206a) is higher than another portion of the mold 114a (e.g., a peripheral portion of surface 206a) by approximately 0.05 mm to 0.2 mm.

In some cases, the mold 114a can be bowed or bent by selectively applying vacuum pressure along the periphery of the mold 114a, while selectively applying positive air pressure along the center of the mold 114a. As an example, as shown in FIG. 3B, the vacuum system 110 can apply vacuum pressure in vacuum channels along the periphery of the mold 114 (e.g., vacuum channels 302a-b and 302e-f), while also applying positive air pressure in vacuum channels along the center of the mold 114a (e.g., vacuum channels 302c and 302d). As a result, the periphery of the mold 114a is secured to the chuck 104a via a suction force, while the center of the mold 114a is forced away from the chuck 104a due to positive air pressure.

In some cases, the mold 114a can be bowed or bent using mechanical mechanisms. For example, in some cases, the periphery of the mold 114a can be gripped by a bracket or mount, and the center of the mold 114a can be pushed upward by a riser, actuator, lever, or other mechanism. In some cases, the vacuum system 110 can be used in conjunction with mechanical mechanisms to bow or bend the mold 114a.

As shown in FIG. 3C, the actuable stage 102 moves the chuck 104a upward, such that the mold 114a and mold 114b are in proximity to one another. In this position, the mold 114a and mold 114b are oriented such that the photocurable material 202 contained within the mold 114a contacts the mold 114b. As described above, the relative position and/or orientation of the chucks 104a and 104b (and/or the relative position and/or orientation of the molds 114a and 114b) can be determined using a sensor assembly 106 and the control module 112).

As shown in FIG. 3D, the actuable stage 102 deskews the mold 114a relative to the mold 114b (e.g., unbows or unbends the mold 114a), such that the surface 206a of the mold 114a is substantially parallel to the surface 206b of the mold 114b. In some cases, an angle between the two surfaces 206a and 206b can less than 1°. In some cases, the flatness of the surfaces 206a and 206b can be such that each surface varies from an ideal flat surface by 100 nm or less (e.g., between 20 nm to 100 nm, or less). In some cases, an angle of 2" of arc or less (e.g., 10 μrad or less) and/or a variation in flatness of 100 nm or less may be particularly suitable for fabricating thin optical polymer films (e.g., 0.1 μm or thinner optical polymer films used in eyepieces).

In some cases, the mold 114a can be unbowed or unbent by applying vacuum pressure and/or discontinuing the application of positive air pressure along some or all of the mold 114a. As an example, as shown in FIG. 3D, the vacuum system 110 can apply vacuum pressure in vacuum channels 302a-f. As a result, the mold 114a is secured to the chuck 104a via a suction force, and the mold 114a is unbent.

In some cases, the mold 114a can be unbowed or unbent using mechanical mechanisms. For example, in some cases, the periphery of the mold 114a can be gripped by a bracket or mount, and the center of the mold 114a can be released or pulled downward by a riser, actuator, lever, or other mechanism. In some cases, the vacuum system 110 can be used in conjunction with mechanical mechanisms to unbow or unbend the mold 114a.

As described above, by first skewing the mold 114a relative to the mold 114b, then positioning the mold 114a such that such that the photocurable material 202 contained within the mold 114a contacts the mold 114b, and subsequently adjusting the mold 114a and 114a such that they are parallel to each other, the occurrence of bubbles trapped within the molds 114a and 114b can be eliminated or otherwise reduced. For instance, in the example depicted in FIG. 3C, bubbles between the molds 114a and 114b will travel towards the periphery of the molds and exit the mold region rather than being trapped between the molds. Thus, the resulting film is less like to have distortions and other structural defects.

Figure 3E:
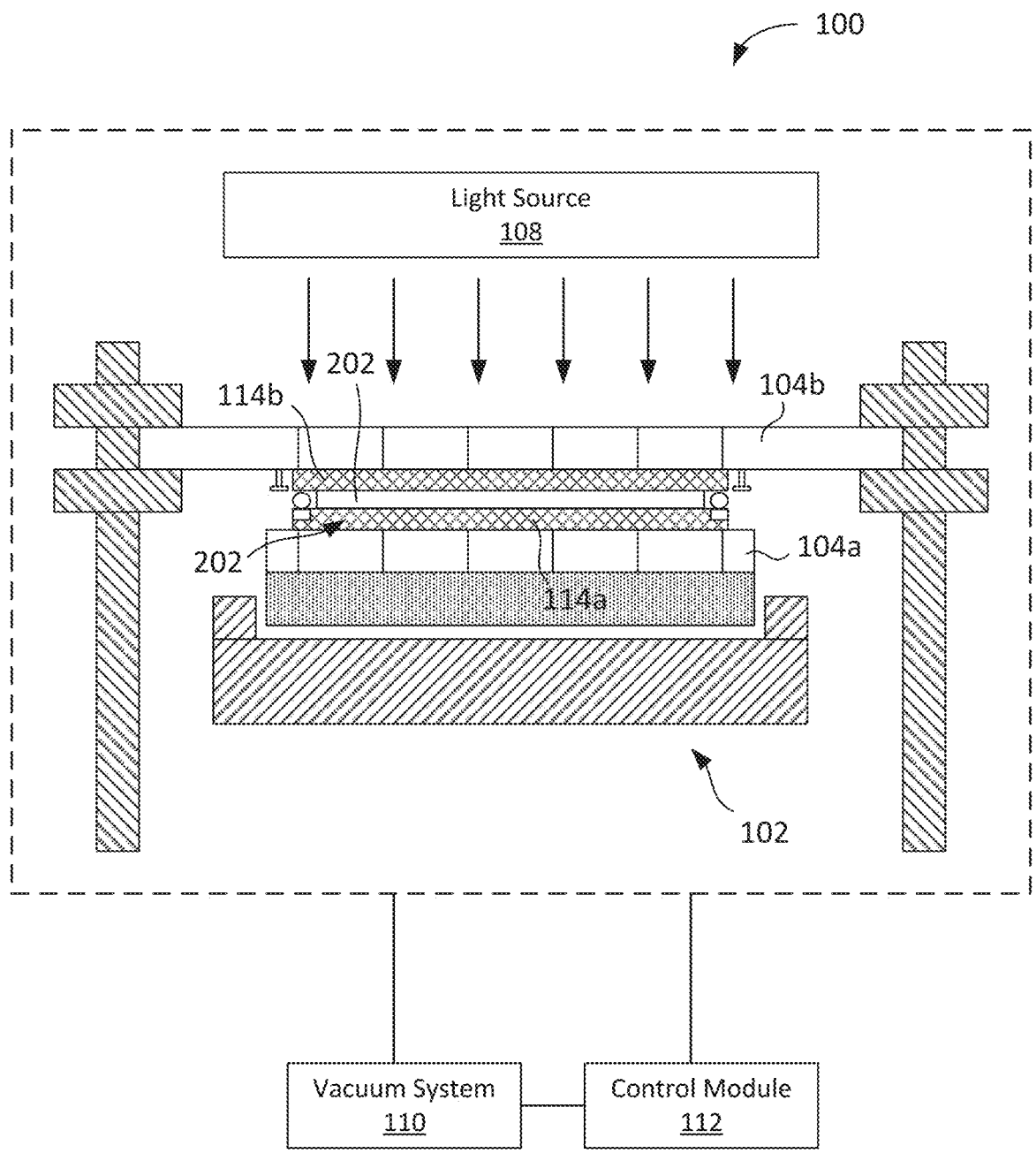

As shown in FIG. 3E, the light source 108 generates one or more wavelengths of radiation suitable for photocuring the photocurable material, and directs it to the photocurable material 202 in the mold region between the molds 114a and 114b. This hardens the photocurable material, resulting in a film.

Figure 3F:
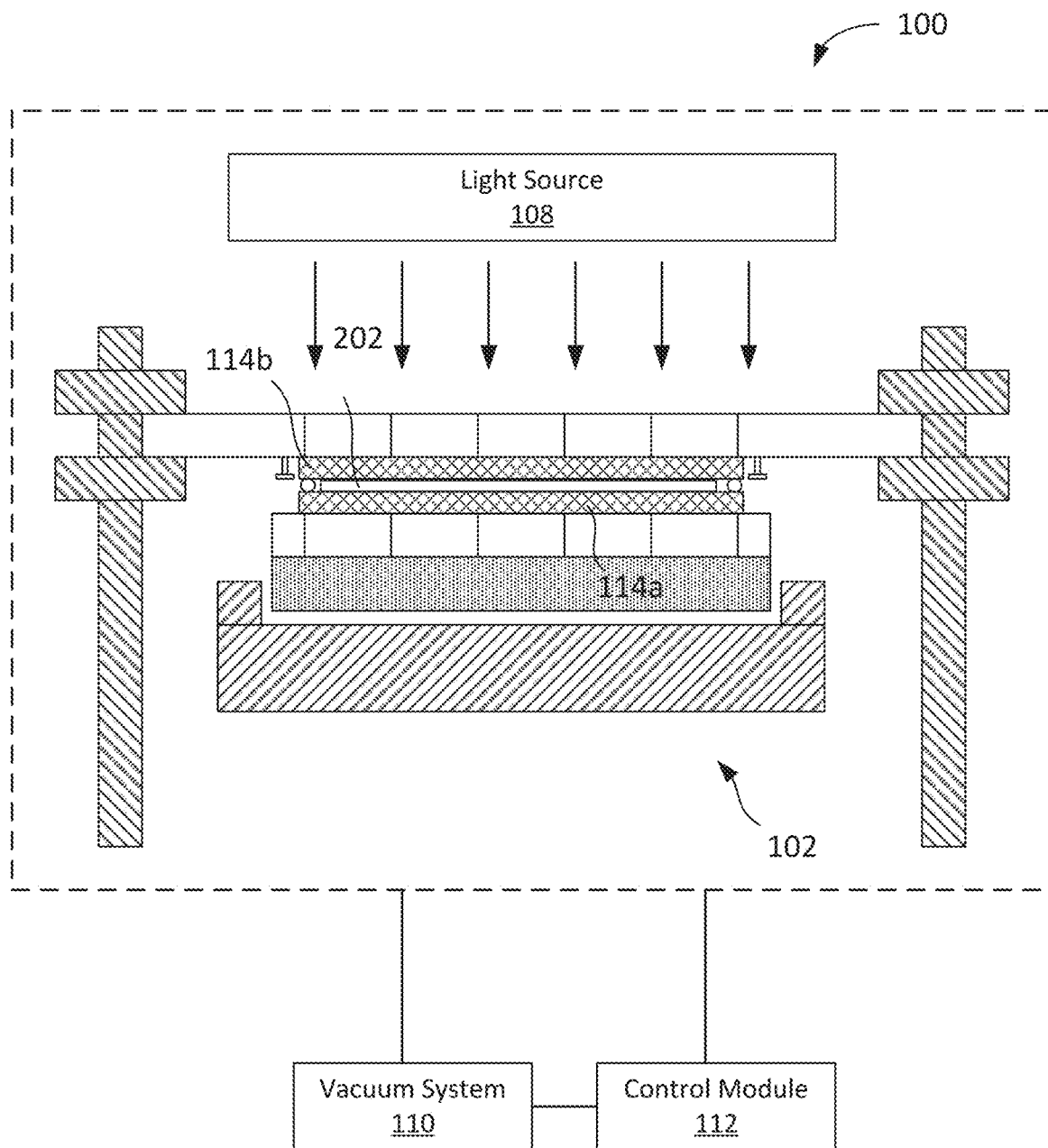

As described above, the photocurable material can expand or contract during the photocuring process. To improve the quality of the film, the control module 112 can adjust the gap region during the photocuring process (e.g., while the light source 108 is generating radiation and/or between sessions of radiation), such that the space between the molds 114a and 114b is adjusted to account for expansion and/or contraction. For example, as shown in FIG. 3F, the mold 114a can be moved nearer the mold 114b during photocuring to account for contractions in the photocurable material during the photocuring process. As noted above, the amount and rate of material expansion or contraction can be experimentally determined based on various factors, and the control module 112 can be configured to expand and/or contract the gap region at a particular empirically determined amount and rate, such that the material expansion and contraction is accounted for.

In some cases, a mold can be both rotated and/or bowed as a part of a pre-wetting procedure. Further, although FIGS. 2A-F and 3A-F show a single mold 114a being skewed relative to mold 114b (e.g., rotated, bowed, or bent relative to the mold 114b), in practice, mold 114b also can be skewed (e.g., rotated, bowed, or bent), either instead of or in addition to the mold 114a.

Figure 4A:
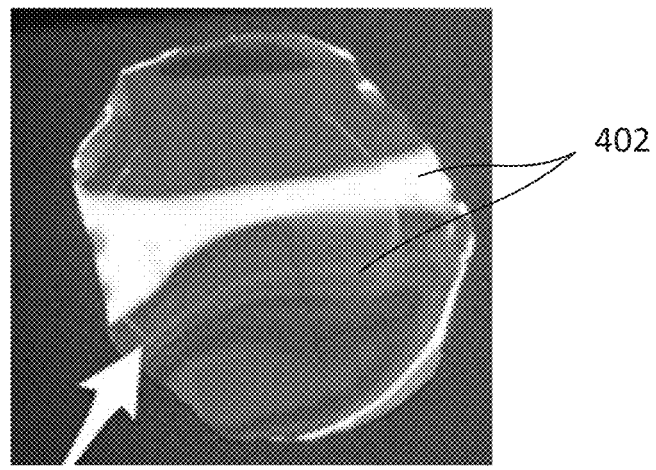
FIGS. 4A and 4B are photographs of example films.

An example film 400 is shown in FIG. 4A. In this example, the film 400 was produced without a pre-wetting process, and without controlling the gap region between molds (either before or during the curing processing). As shown in FIG. 4A, the film 400 is distorted, and includes defects such as wrinkles and uneven thickness (e.g., wrinkles 402, visible as a distorted reflection).

Figure 4B:
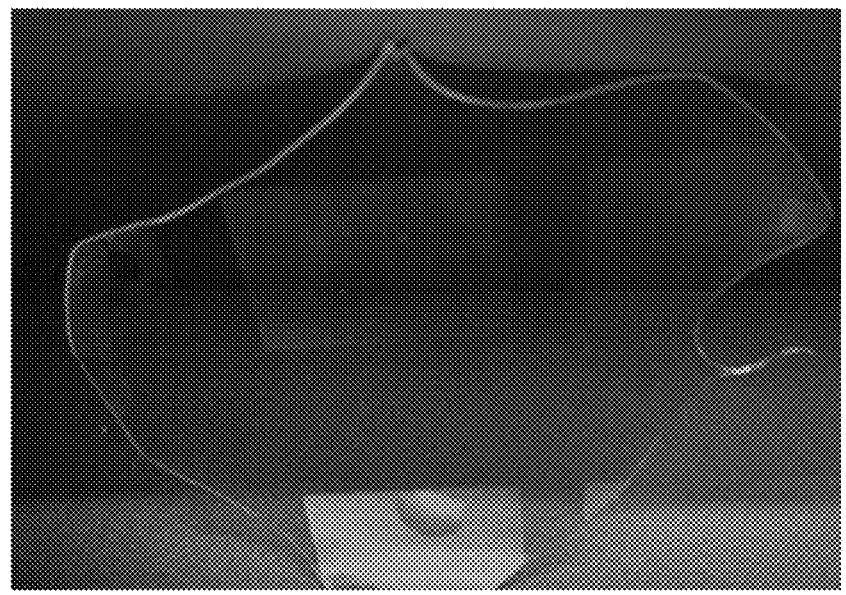

Another example film 450 is shown in FIG. 4B. In this example, the film 450 was produced with a pre-wetting process, and by controlling the gap region between molds (both before or during the curing processing). As shown in FIG. 4B, the film 450 is substantially less distorted than film 400, exhibits fewer or substantially no wrinkles, and is significantly more even in thickness. Accordingly, the film 450 may be more suitable for use in variation-sensitive applications (e.g., as a part of eyepieces in an optical imaging sy stem).

In the example systems shown in FIGS. 1, 2A-2F, and 3A-F, each system provides a single "station" for producing polymer film. For instance, each system can be used to produce a single polymer film at a time. Upon completion of a polymer film, the polymer film can be collected from the system, and the system can begin production of a new polymer film.

However, in practice, a system need not be limited to a single station (e.g., limited to producing a single polymer film at a time). For example, in some cases, a system can provide multiple stations, each of which can be used to produce a respective polymer film. Further, each of the stations can be operated in conjunction. This can be beneficial, for example, as it enables a system to produce polymer film more quickly and/or efficiently (e.g., by simultaneously producing multiple polymer films in a parallelized manner).

Figure 5A:
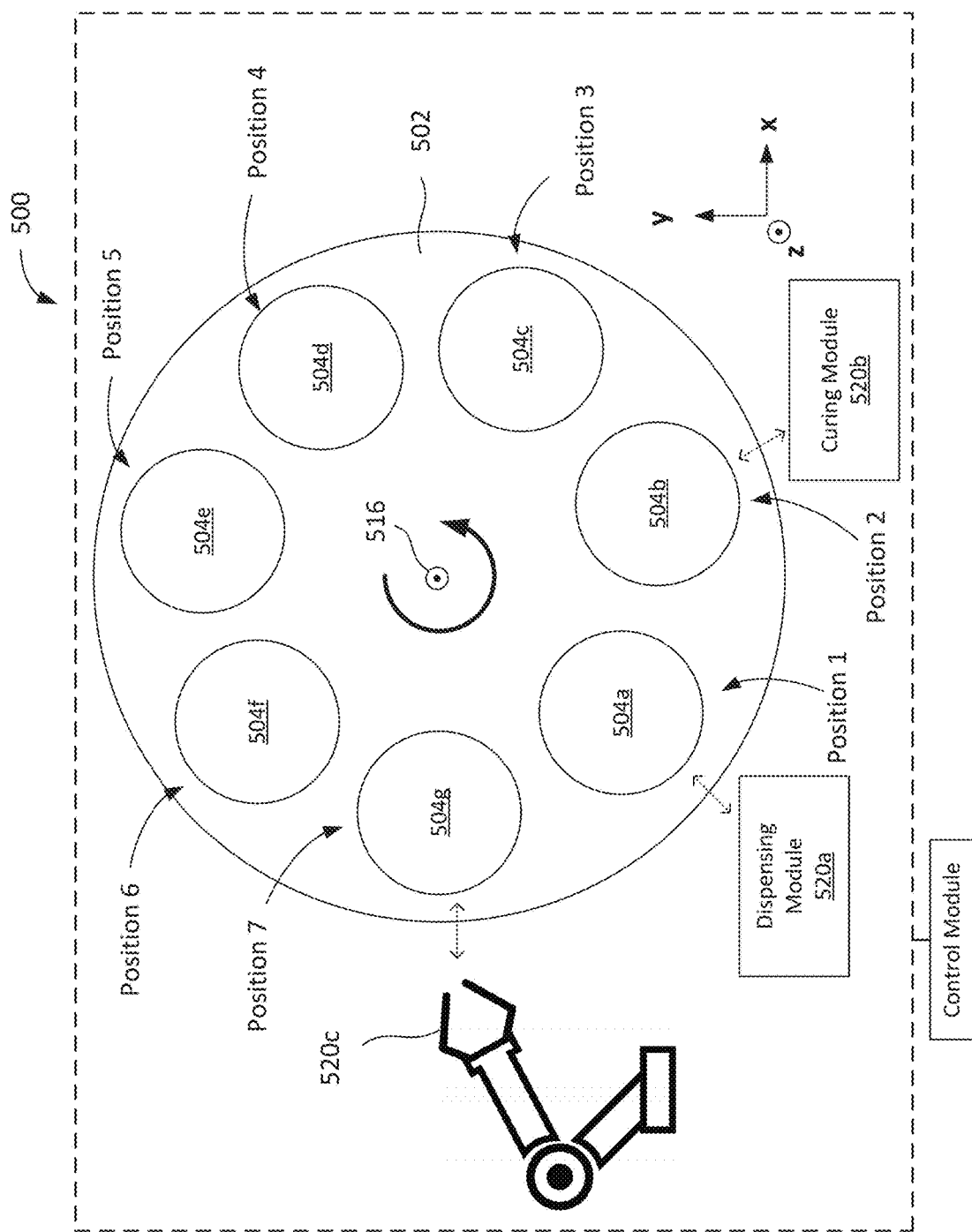
FIGS. 5A and 5B are diagrams of another example system for producing polymer film.

As an illustrative example, a system 500 is shown in FIGS. 5A (top view) and 5B (side view). The system 500 includes a rotatable platform 502 having multiple stations 504a-g circumferentially distributed about the platform 502. Each station 504a-g can be operated simultaneously to produce a respective polymer film. In some cases, each station 504a-g can include some or all of the components of the system 100 shown in FIGS. 1, 2A-2F, and 3A-F. For ease of illustration, components of each station 504a-g have been omitted in FIGS. 5A and 5B.

Figure 5B:
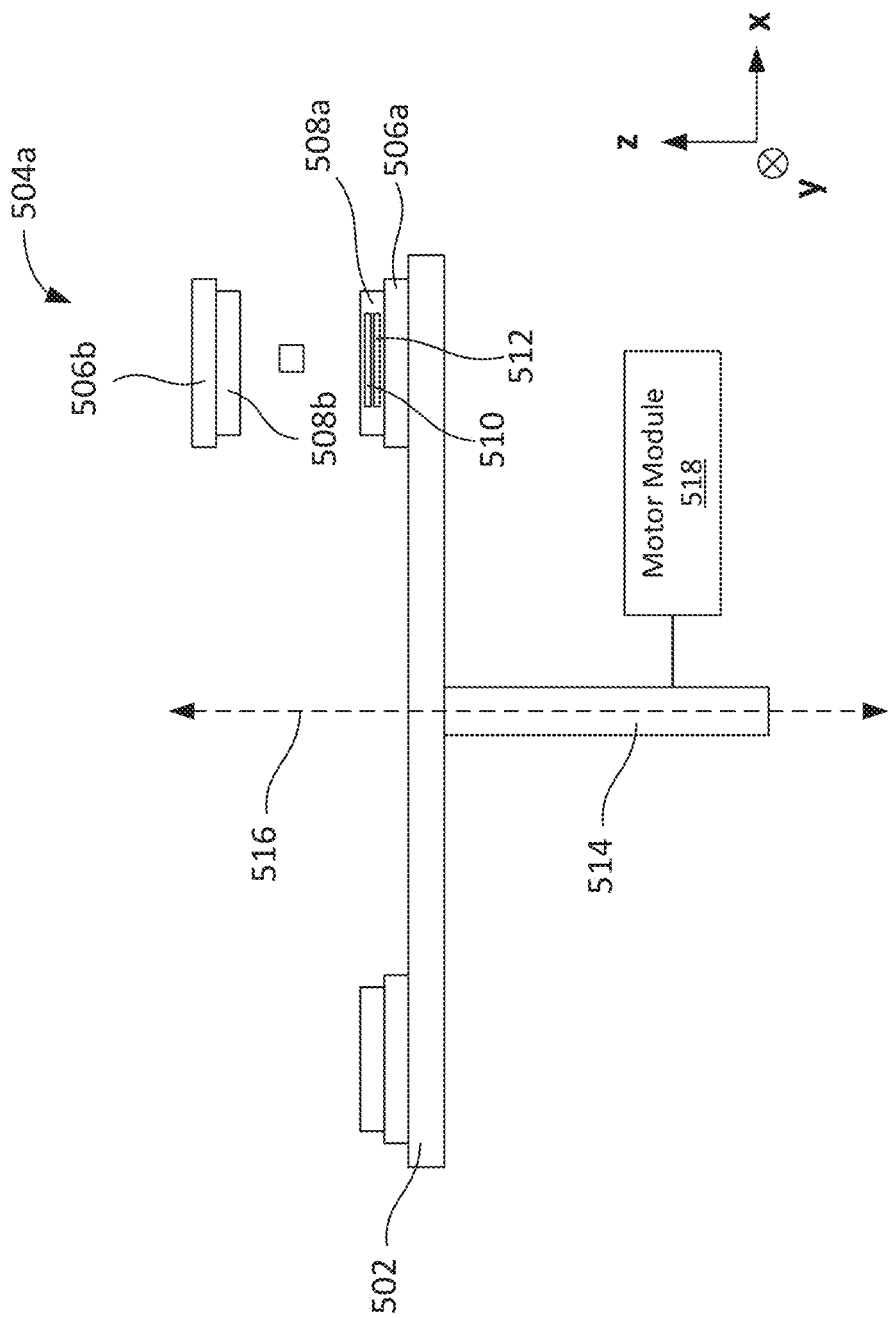

In some cases, each station can include one or more actuable stages for adjusting the relative positions or orientations of a pair of chucks. For example, as shown in FIG. 5B, a station 504a can include an actuable stage 506a to position a chuck 508a relative to a chuck 508b. As another example, the station 504a can include an actuable stage 506b to position the chuck 508b relative to the chuck 508a.

In some cases, one or both of the actuable stages 506a and 506b can be similar to the actuable stage 102 described above. For example, in some cases, the actuable stages 506a and 506b can manipulate the chucks 508a and 508b according to one or more degrees of freedom. In some cases, one actuable stage can be used to adjust a chuck according to one or more particular degrees of freedom, while another actuable stage can be used to adjust another chuck according to one or more other degrees of freedom. As an example, the actuable stage 506a can be used to translate the chuck 508a in the x and y directions, while the actuable stage 506b can be used to translate the chuck 508b in the z direction and rotate the chuck 508b about the x and y axes (e.g., to tilt the chuck 508b). In practice, other combinations are also possible, depend on the implementation. Similarly, each of the other stations 504b-g also can include one or more actuable stages to adjust the relative positions or orientations of its respective pair of chucks.

Further, each station can include a heating element and/or a cooling element to control the temperature of materials (e.g., photocurable materials) at that station. For instance, as shown in FIG. 5B, the station 504a can include a heating element 510 to apply heat to the chuck 508a, and a cooling element 512 to cool the chuck 508a. This can be useful, for example, in facilitating the photocuring process. For example, heat can be applied to a photocurable material to promote annealing. Example heating elements include flexible electric strip heaters, and thermoelectric coolers. As another example, the photocurable material can be cooled after annealing, such that it can be more easily collected. Example cooling elements include thermoelectric coolers and liquid-based coolers. Other temperature-dependent processes can also be performed. Similarly, each of the other stations 504b-g also can include one or more heating elements and/or cooling elements.

Further, the system 500 can rotate the rotatable platform 502 to reposition the stations 504a-g. For instance, the system 500 can include can include an axle 514 positioned along a central axis 516 of the rotatable platform 502. The system 500 can rotate the axle 514 (e.g., using a motor module 518) to rotate the platform 502 and reposition the stations 504a-g.

The rotatable platform 502 can provide several benefits. For example, as described with respect to FIGS. 2A-2F and 3A-F, a polymer film can produced by performing several different steps in a sequence. Further, each step can be performed using particular components of the system. The rotatable platform 502 enables certain components of the system to be used across several different stations 504*a-g*, thereby reducing the complexity and/or cost of implementing, operation, and maintaining the system. For instance, a particular component can be positioned next to the rotatable platform 502 at a particular position, and the rotatable platform 502 can rotate such that a particular station is positioned in proximity to that component. Once the station is properly positioned, the component can be used to perform a particular step of the production process. After completion of the step, the rotatable platform 502 can be rotated such that a different station is positioned in proximity to the component, and the component can be used to repeat the step on the new station. Further, this process can be repeated one or more times across one or more additional stations. In this manner, one or more common components can be used to perform particular steps across multiple different stations.

As an example, as shown in FIG. 5A, the system 500 can include a dispensing module 520*a* in proximity to Position 1 of the rotatable platform 502 (currently occupied by the station 504*a*), a curing module 520*b* in proximity to Position 2 (currently occupied by the station 504*b*), and a collection module 520*c* in proximity to Position 7 (currently occupied by the station 504*g*).

During operation of the system 500, the dispensing module 520*a* dispenses materials into the station at Position 1. For instance, the dispensing module 520*a* can include one or more pumps, pipettes, or other dispensing mechanisms for depositing photocurable material into a station's mold.

After the photocurable material is dispensed, the rotatable platform 502 is rotated (e.g., counter-clockwise) such that the station at Position 1 is repositioned at Position 2. Once the station is repositioned, the curing module 520*b* cures the photocurable material. For instance, the curing module 520*b* can include one or more light sources configured to generate one or more wavelengths of radiation suitable for photocuring photocurable material. The photocurable material in the station at Position 2 can be exposed to this radiation to facilitate curing into a polymer film.

After the photocurable material is dispensed, the rotatable platform 502 is rotated (e.g., counter-clockwise) such that the station at Position 2 is repositioned at Position 3. When a station is in this position, the photocurable material can be subjected to temperature-dependent processes. For instance, the photocurable material can be heated (e.g., using a heating element 510) to promote annealing.

As the rotatable platform 502 continues to rotate, the station is subsequently repositioned to Position 4, then to Position 5, and then to Position 6. At each of these positions, the photocurable material can continue to be subjected to temperature-dependent processes. For example, the photocurable material can be additionally heated (e.g., using the heating element 510). As another example, the photocurable material can be cooled (e.g., using the cooling element 512) to end the annealing process and/or facilitate collection of the polymer film.

As the rotatable platform 502 continues to rotate, the station is subsequently repositioned to Position 7. Once the station is repositioned, the collection module 520*c* collects the polymer film from the station. For instance, the collection module 520*c* can include one or more robotic manipulation mechanisms configured to separate the polymer film from the mold, and extract the polymer film from the station.

As described above, each of the stations can be operated in conjunction to simultaneously produce multiple polymer films in a parallelized manner. For example, each of the stations 504*a-g* can be sequentially rotated across the Positions 1-7 to perform each of the steps for producing polymer film in a sequence. Further, although seven stations 504*a-g* are shown in FIG. 5A, this is merely an illustrative example. In practice, there are can any number of stations (e.g., one, two, three, four, five, etc.).

The system 500 can also have a control module 550 to control the operation of the system 500. For example, the control module 550 can be communicatively coupled to the motor module 518 to control the rotation of the rotatable platform 502, the dispensing module 520*a* to control the dispensing of materials, the curing module 520*b* to control the application of radiation, and/or the collection module 520*c* to control the collection of polymer films. The control module 550 can also be communicatively coupled to one or more the stations 504*a-g* to control their operations (e.g., to control the actuable stages, the heating and cooling elements, etc.).

In the example shown in FIG. 5B, each station includes a respective actuable stage dedicated to manipulating the lower chuck at that station. For example, as shown in FIG. 5B, the station 504*a* can include an actuable stage 506*a* for specifically manipulating the lower chuck 508*a*. However, this need not be the case. In some cases, a single actuable stage can be used to manipulate lower chucks across multiple different stations. For example, an actuable stage can be positioned at a particular position with respect to the rotatable platform 502 (e.g., one of Position 1-7), and can be configured to manipulate the lower chucks of whichever station is positioned at that particular position. As the rotatable platform 502 is rotated, the actuable stage can manipulate the lower chucks of different stations as they move into through that position. In this manner, a single actuable stage can be used to manipulate the lower chucks across multiple different stations, without requiring that each station include a separate actuable stage.

Figure 6:
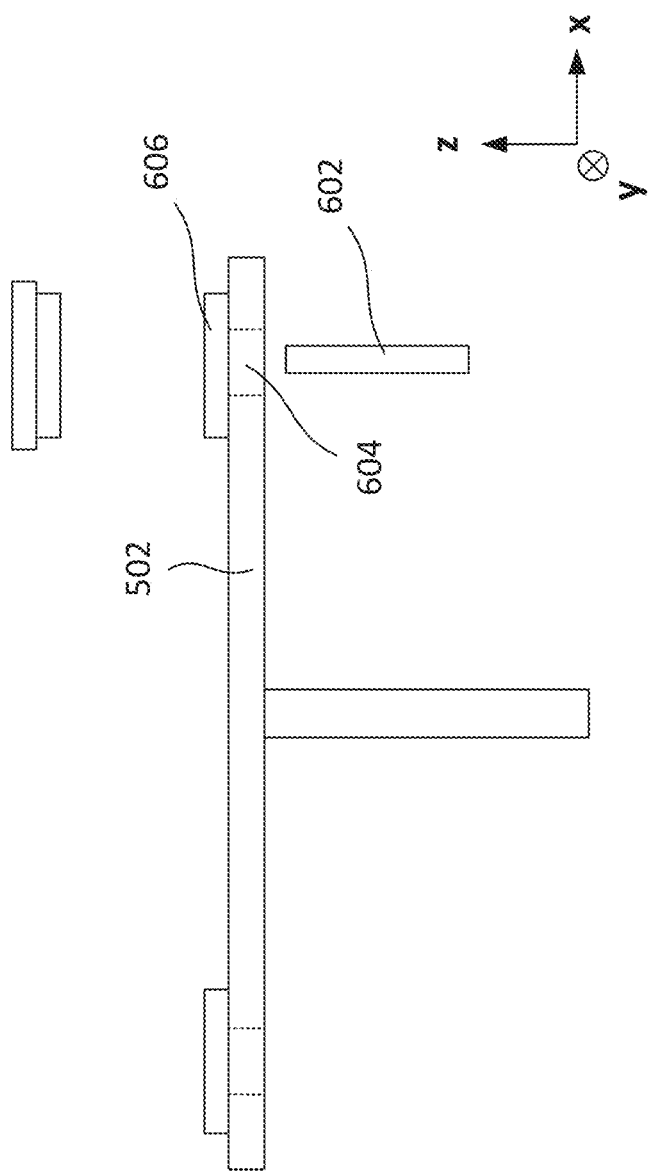
FIG. 6 is a diagram of another example system for producing polymer film.

As an example, as shown in FIG. 6, a single actuable stage 602 can be used to manipulate the lower chucks of multiple different stations. In this example, the rotatable platform 502 defines an aperture 604 at each of the positions of the stations. Further, at each position, a lower chuck 606 is positioned over the aperture 604. The dimensions of the lower chuck 606 are larger than those of the aperture 604 (e.g., larger diameter, width, and/or length), such that the lower chuck 606 does not fall through the aperture 604. Once a particular station is positioned over the actuable stage 602, the actuable stage 602 can be moved upward through the aperture 604 to push the lower chuck 606 in an upward direction (e.g., to translate the lower chuck 606 along the z direction). Further, the actuable stage 602 can be laterally to translate the lower chuck 606 across one or more additional directions (e.g., to translate the lower chuck 606 along the x and/or y directions). The actuable stage 602 can be retracted, and the rotatable platform 502 can be rotated to position another lower chuck over the actuable stage 602.

Figure 7:
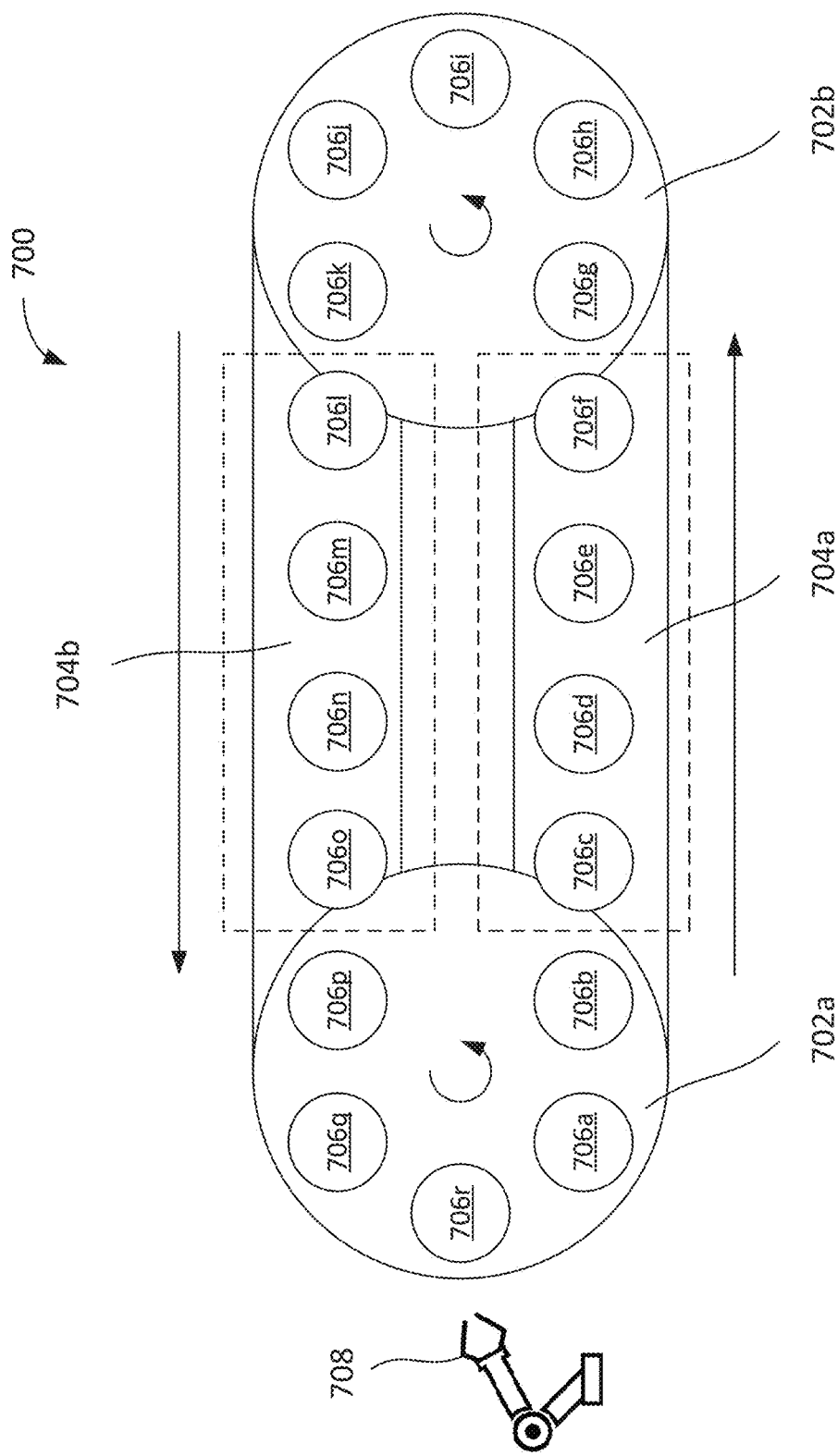
FIG. 7 is a diagram of another example system for producing polymer film.

In some cases, a system can include multiple different rotatable platforms to facilitate the production of polymer films. As an example, FIG. 7 shows a system 700 for simultaneously producing multiple polymer films. The system 700 can be similar to the system 500 shown in FIG. 5A, and can include one or more of the components shown in FIG. 5A (for ease of illustration, various components are omitted, such as the dispensing module, curing module, control module, etc.). However, in this example, the system includes two rotatable platforms 702*a* and 702*b*. The rotatable platforms 702*a* and 702*b* are interconnected by two conveyors 704*a* and 704*b* (e.g., conveyor belts, rollers, tracks, etc.). Further, several stations 706*a-r* are positioned on the rotatable platforms 702a and 702b and/or the conveyors 704a and 704b. During operation of the system 700, the rotatable platforms 702a and 702b rotate (e.g., counter-clockwise) to reposition each of the stations 706a-r with respect to one or more other components of the system (e.g., a collection module 708, a dispensing module, a curing module, etc.). Further, stations 706a-r can be transferred between the rotatable platforms 702a and 702b using the conveyors 704a and 704b. This can be beneficial, for example, as it enables the system 700 to simultaneously handle a larger number of stations.

In some cases, the system 700 can include heating regions and/or cooling regions to control the temperature of materials (e.g., photocurable materials) at one or more stations. As an example, the system 700 can include a heating region 710a to apply heat to stations as they pass through the heating region 710a (e.g., to promote annealing). Example heating regions include chambers or areas heated by ultraviolet and/or infrared curing lamps, or other heating elements. As another example, the system 700 can include a cooling region 710b to cool the stations as they pass through the cooling region 710b (e.g., so that polymer films can be more easily collected). Example cooling regions include chambers or areas cooled by force air cooling mechanisms or other cooling elements. Other temperature-dependent processes can also be performed using one or more heating regions and/or cooling regions.

Although several stations 706a-r are shown in FIG. 7, this is merely an illustrative example. In practice, there are can any number of stations (e.g., one, two, three, four, five, etc.). Further, although two rotatable platforms 702a and 702b and two conveyors 704a and 704b are shown in FIG. 7, this is also merely an illustrative example. In practice, there are can any number of rotatable platforms and/or conveyors (e.g., one, two, three, four, five, etc.).

Figure 8:
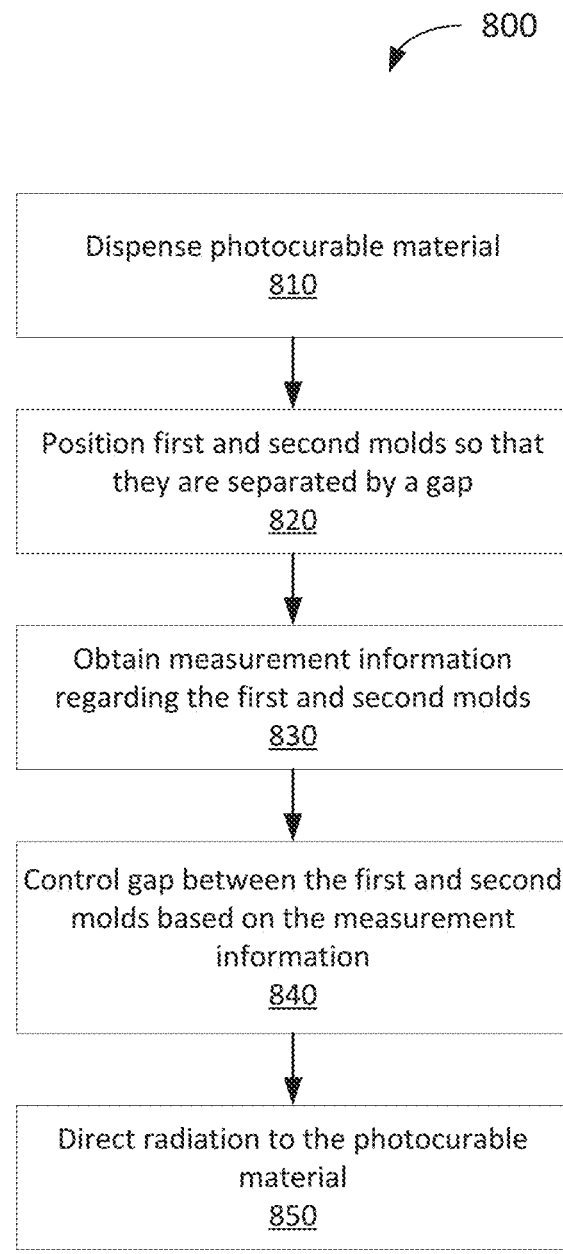
FIG. 8 is a flowchart diagram of an example process for casting a polymer film by photocuring a photocurable material.

An example process 800 for casting a polymer film by photocuring a photocurable material is shown in FIG. 8.

A photocurable material is dispensed onto a first surface of a first mold (step 810).

After a photocurable material is dispensed onto the first surface of the first mold, the first mold and a second mold are positioned such that the first surface and a second surface of the second mold are separated by a gap (step 820).

After the first and second molds are positioned, measurement information is obtained regarding the first and second molds (step 830). The measurement information can include information indicative of a distance between the first and second molds at each of at least three locations and/or a pressure at each of at least three locations between the first and second molds during use of the system.

In some cases, the measurement information can be obtained using one or more capacitive sensors. In some cases, the measurement information can be obtained using three or more capacitive sensors.

In some cases, obtaining the measurement information can include determining, using one or more pressure sensors, a pressure applied to each of one or more mechanical spacers disposed between the first and second molds and/or along a periphery of the first and second molds. In some cases, obtaining the measurement information can include determining, using three or more pressure sensors, a pressure applied to each of three or more mechanical spacers disposed between the first and second molds and/or along a periphery of the first and second molds.

The gap between the first and second molds surfaces is controlled based on the measurement information (step 840).

One or more wavelengths of radiation suitable for photocuring the photocurable material are directed to the photocurable material (step 850). In some cases, the one or more wavelengths of the radiation can include at least one of an ultraviolet wavelength or a visible wavelength.

In some cases, the process 800 can also include arranging the first mold relative to a second mold in a first configuration. In the first configuration, the first surface of the first mold faces the second surface of the second mold and is skewed with respect to the second surface, and the photocurable material contacts the second surface of second mold.

In some cases, in the first configuration, an angular displacement between the first surface of first mold and the second surface of second mold can be between approximately 1° and 10°.

In some cases, in the first configuration, the second surface of second mold can be bowed with respect to the first surface. For example, one portion of one surface (e.g., a center portion of that surface) can differ in height from another portion of that surface (e.g., a peripheral portion of that surface) by approximately 0.05 mm to 0.2 mm.

The second surface of the second mold can be bowed by applying pressure to a central portion of the second mold.

In some cases, in the first configuration, an angular displacement between the first surface of first mold and the second surface of second mold can be between approximately 1° and 10°, and the second surface of second mold can be bowed with respect to the first surface.

In some cases, subsequent to arranging the first mold and the second mold in the first configuration, the first mold and the second mold can be arranged in a second configuration. In the second configuration, the first surface and the second surface can be substantially parallel. In some cases, in the second configuration, an angular displacement between the first surface and the second can be less than 1°0 . In some cases, an angle of 2" of arc or less (e.g., 10 μrad or less) and/or a variation in flatness of 100 nm or less may be particularly suitable for fabricating optical polymer films (e.g., 0.1 μm or thinner optical polymer films used in eyepieces).

In some cases, subsequent to arranging the first mold and the second mold in the second configuration, one or more wavelengths of radiation suitable for photocuring the photocurable material can be directed to the photocurable material. Further, while directing the radiation to the photocurable material, the distance between the first and second molds can be increased or decreased over a period of time (e.g., by moving one or both chucks relative to one another). In some cases, the distance between the first and second molds can be decreased or increased continuously over the period of time (e.g., continuously during the photocuring process). In some cases, the distance between the first and second molds can be decreased or increased intermittently over the period of time (e.g., intermittently during the photocuring process). In some cases, a position of at least one of the first mold or the second mold can be adjusted using a rotatable platform.

Some implementations of subject matter and operations described in this specification can be implemented in digital electronic circuitry, or in computer software, firmware, or hardware, including the structures disclosed in this specification and their structural equivalents, or in combinations of one or more of them. For example, in some implementations, the control modules 112 and/or 550 can be implemented using digital electronic circuitry, or in computer software, firmware, or hardware, or in combinations of one or more of them. In another example, the processes shown in FIGS. 2A-F, 3A-F, 5A-E, 6, 7 and 8 can be implemented, at least in part, using digital electronic circuitry, or in computer software, firmware, or hardware, or in combinations of one or more of them.

Some implementations described in this specification can be implemented as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Figure 9:
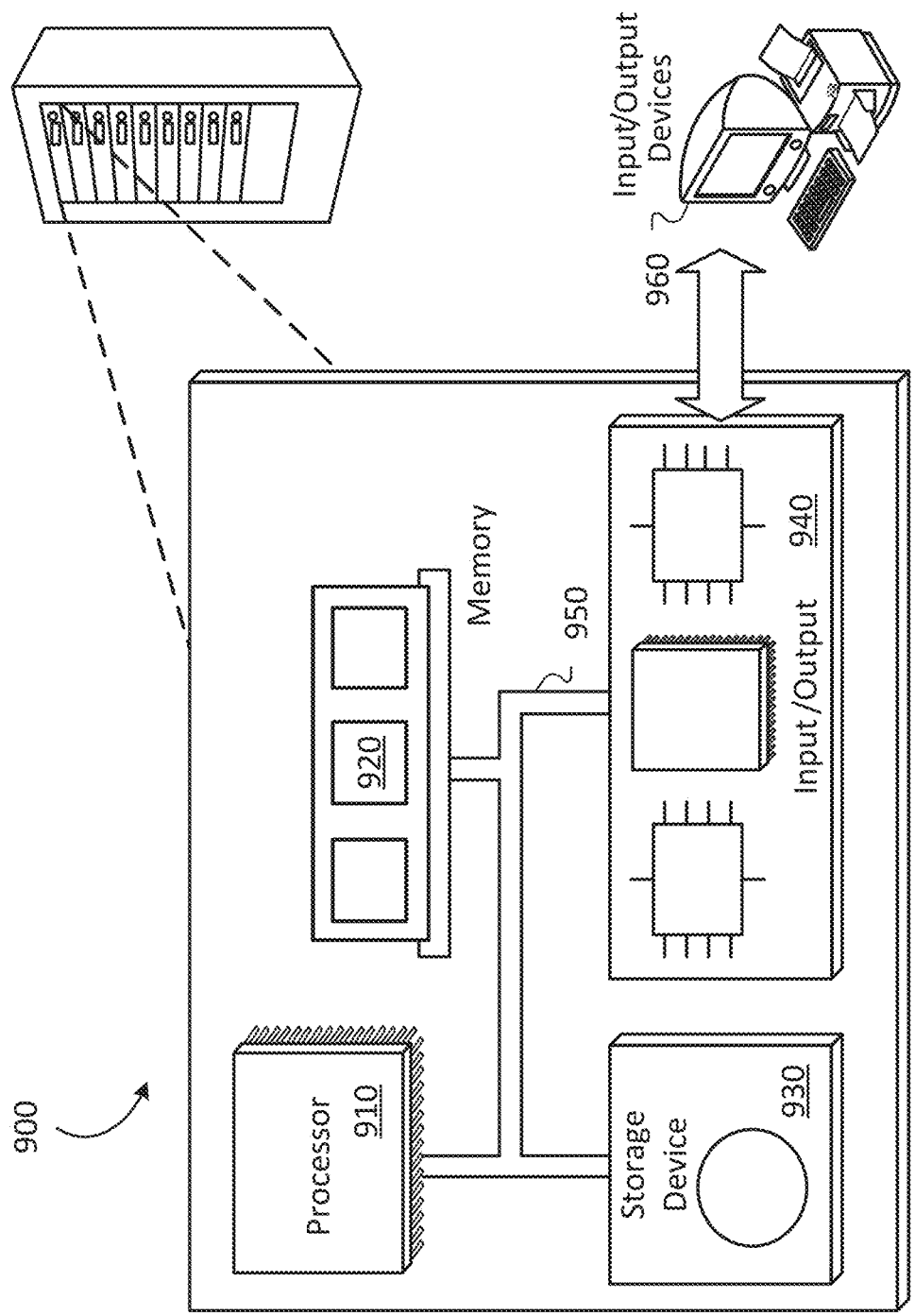
FIG. 9 is a diagram of an example computer system.

FIG. 9 shows an example computer system 900 that includes a processor 910, a memory 920, a storage device 930 and an input/output device 940. Each of the components 910, 920, 930 and 940 can be interconnected, for example, by a system bus 950. The processor 910 is capable of processing instructions for execution within the system 900. In some implementations, the processor 910 is a single-threaded processor, a multi-threaded processor, or another type of processor. The processor 910 is capable of processing instructions stored in the memory 920 or on the storage device 930. The memory 920 and the storage device 930 can store information within the system 900.

The input/output device 940 provides input/output operations for the system 900. In some implementations, the input/output device 940 can include one or more of a network interface devices, e.g., an Ethernet card, a serial communication device, e.g., an RS-232 port, and/or a wireless interface device, e.g., an 802.11 card, a 3G wireless modem, a 4G wireless modem, etc. In some implementations, the input/output device can include driver devices configured to receive input data and send output data to other input/output devices, e.g., keyboard, printer and display devices 960. In some implementations, mobile computing devices, mobile communication devices, and other devices can be used.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of implementations have been described. Nevertheless, it will be understood that various modifications may be made without departing from the spirit and scope of the invention. Accordingly, other implementations are within the scope of the following claims.

What is claimed is:

1. A method comprising:
   dispensing a photocurable material onto a first surface of a first mold;
   positioning the first mold and a second mold such that the first surface and a second surface of the second mold are separated by a gap;
   obtaining measurement information indicative of a pressure at each of at least three locations between the first and second molds during use of the system, wherein obtaining the measurement information comprises:
      determining, using a first pressure sensor, a first pressure applied to a first mechanical spacer,
      determining, using a second pressure sensor, a second pressure applied to a second mechanical spacer, and
      determining, using a third pressure sensor, a third pressure applied to a third mechanical spacer,
      wherein the first mechanical spacer, the second mechanical spacer, and the third mechanical spacer are disposed at different locations between the first and second molds and/or at different locations along a periphery of the first and second molds, and
      wherein the first mechanical spacer is disposed above the first pressure sensor, wherein the second mechanical spacer is disposed above the second pressure sensor, and wherein the third mechanical spacer is disposed above the third pressure sensor; and
   determining a first distance between the first and second molds surfaces at a first location based on the first pressure applied to the first mechanical spacer;
   determining a second distance between the first and second molds surfaces at a second location based on the second pressure applied to the second mechanical spacer;
   determining a third distance between the first and second molds surfaces at a third location based on the third pressure applied to the third mechanical spacer, wherein the first, second, and third locations are different; and
   controlling the gap between the first and second molds surfaces based on the measurement information.

2. The method of claim 1, further comprising directing, to the photocurable material, one or more wavelengths of radiation suitable for photocuring the photocurable material.

3. The method of claim 2, wherein the one or more wavelengths of the radiation comprise at least one of an ultraviolet wavelength or a visible wavelength.

4. The method of claim 1, wherein the gap between the first and second molds is controlled further based on measurements obtained by one or more capacitive sensors.

5. The method of claim 1, wherein the gap between the first and second molds is controlled further based on measurements obtained by three or more capacitive sensors.

6. The method of claim 1, further comprising arranging the first mold relative to a second mold in a first configuration, wherein in the first configuration:
   the first surface of the first mold faces the second surface of the second mold and is skewed with respect to the second surface; and
   the photocurable material contacts the second surface of second mold.

7. The method of claim 6, wherein in the first configuration, an angular displacement between the first surface of first mold and the second surface of second mold is between approximately 1° and 10 °.

8. The method of claim 6, wherein in the first configuration, the second surface of second mold is bowed with respect to the first surface.

9. The method of claim 8, wherein the second surface of the second mold is bowed by applying pressure to a central portion of the second mold.

10. The method of claim 6, wherein in the first configuration:
    an angular displacement between the first surface of first mold and the second surface of second mold is between approximately 1° and 10°, and
    the second surface of second mold is bowed with respect to the first surface.

11. The method of claim 6, further comprising:
    subsequent to arranging the first mold and the second mold in the first configuration, arranging the first mold and the second mold in a second configuration,
    wherein in the second configuration, the first surface and the second surface are substantially parallel.

12. The method of claim 6, further comprising:
    subsequent to arranging the first mold and the second mold in the first configuration, arranging the first mold and the second mold in a second configuration,
    wherein in the second configuration, an angular displacement between the first surface and the second surface is less than 10 μrad.

13. The method of claim 12, further comprising:
    subsequent to arranging the first mold and the second mold in the second configuration, directing, to the photocurable material, one or more wavelengths of radiation suitable for photocuring the photocurable material.

14. The method of claim 13, further comprising:
    while directing the radiation to the photocurable material, decreasing or increasing the distance between the first and second molds over a period of time.

15. The method of claim 14, wherein the distance between the first and second molds is decreased or increased continuously over the period of time.

16. The method of claim 14, wherein the distance between the first and second molds is decreased or increased intermittently over the period of time.

17. The method of claim 1, further comprising adjusting a position of at least one of the first mold or the second mold using a rotatable platform.

18. The method of claim 1, wherein each of the first, the second, and the third mechanical spacers protrudes from one of:
- the first surface of the first mold, or
- the second surface of the second mold.

* * * * *